(12) United States Patent
Majumder et al.

(10) Patent No.: US 8,645,901 B2
(45) Date of Patent: Feb. 4, 2014

(54) VISUALIZATION AND INFORMATION DISPLAY FOR SHAPES IN DISPLAYED GRAPHICAL IMAGES BASED ON A CURSOR

(75) Inventors: Chayan Majumder, Delhi (IN); Donald J. O'Riordan, Sunnyvale, CA (US); Shagufta Siddique, New Delhi (IN)

(73) Assignee: Cadence Design Systems, Inc., San Jose, CA (US)

( * ) Notice: Subject to any disclaimer, the term of this patent is extended or adjusted under 35 U.S.C. 154(b) by 407 days.

(21) Appl. No.: 12/628,900

(22) Filed: Dec. 1, 2009

(65) Prior Publication Data

US 2011/0131544 A1 Jun. 2, 2011

(51) Int. Cl.
*G06F 17/50* (2006.01)

(52) U.S. Cl.
USPC ........... 716/139; 715/210; 715/243; 715/273; 715/700

(58) Field of Classification Search
USPC ................... 716/139; 715/210, 243, 273, 700
See application file for complete search history.

(56) References Cited

U.S. PATENT DOCUMENTS

| | | | |
|---|---|---|---|
| 5,210,554 A | 5/1993 | Cornsweet et al. | |
| 5,378,904 A | 1/1995 | Suzuki et al. | |
| 5,724,072 A | 3/1998 | Freeman et al. | |
| 5,867,399 A | 2/1999 | Rostoker et al. | |
| 6,012,071 A * | 1/2000 | Krishna et al. | 715/201 |
| 6,115,034 A | 9/2000 | Tanaka et al. | |
| 6,289,489 B1 | 9/2001 | Bold et al. | |
| 6,396,475 B1 | 5/2002 | Ellenby et al. | |
| 6,470,482 B1 | 10/2002 | Rostoker et al. | |
| 6,587,995 B1 | 7/2003 | Duboc et al. | |
| 6,684,376 B1 | 1/2004 | Kerzman et al. | |
| 6,711,729 B1 | 3/2004 | McElvain et al. | |
| 6,826,735 B2 * | 11/2004 | Ono et al. | 716/112 |
| 6,910,200 B1 | 6/2005 | Aubel et al. | |
| 7,168,041 B1 | 1/2007 | Durrill et al. | |
| 7,243,314 B2 | 7/2007 | Ting | |
| 7,257,794 B2 * | 8/2007 | Tang et al. | 716/122 |
| 7,263,680 B2 * | 8/2007 | Drapeau | 716/126 |
| 7,350,160 B2 * | 3/2008 | Perez et al. | 716/119 |

(Continued)

FOREIGN PATENT DOCUMENTS

JP 63075752 A 4/1988
JP 06259484 A 9/1994

(Continued)

OTHER PUBLICATIONS

Antonio J. Lopez Martin, Cadence Design Environment, Klipsch Schll of Electrical and Computer Engineering, New Mexico State University, Oct. 2002.*

(Continued)

*Primary Examiner* — Thuan Do
*Assistant Examiner* — Brian Ngo
(74) *Attorney, Agent, or Firm* — Sawyer Law Group, P.C.

(57) ABSTRACT

Graphical viewing of shapes and descriptive information in displayed graphical images. In one aspect, shape information is displayed in a graphical interface using a computer system and includes causing a display of an image and one or more shapes in the image, and causing a display of a cursor. Labels are also displayed, each of the labels associated with a different one of the displayed shapes. The plurality of labels are displayed within a predetermined zone relative to a displayed cursor, and wherein no labels are displayed outside of the zone.

20 Claims, 18 Drawing Sheets

(56) References Cited

U.S. PATENT DOCUMENTS

| | | |
|---|---|---|
| 7,383,092 B2 | 6/2008 | Tamura et al. |
| 7,676,348 B2 | 3/2010 | Okada |
| 7,865,857 B1 | 1/2011 | Chopra et al. |
| 7,912,692 B2 | 3/2011 | Matsushita et al. |
| 8,069,428 B1 | 11/2011 | Ogami et al. |
| 8,074,181 B2 | 12/2011 | Zaman et al. |
| 8,146,027 B1 | 3/2012 | Lindop et al. |
| 8,214,791 B1 | 7/2012 | O'Riordan |
| 8,224,636 B2 | 7/2012 | Kundert |
| 8,225,243 B2 | 7/2012 | Koga et al. |
| 8,230,359 B2 | 7/2012 | Robertson et al. |
| 2001/0047508 A1 | 11/2001 | Miura et al. |
| 2002/0157067 A1 | 10/2002 | Yaguchi |
| 2003/0058436 A1* | 3/2003 | Ono et al. .......... 356/237.2 |
| 2003/0076350 A1 | 4/2003 | Vu |
| 2003/0110464 A1 | 6/2003 | Davidson et al. |
| 2004/0128638 A1 | 7/2004 | Kerzman et al. |
| 2004/0153988 A1* | 8/2004 | Ito et al. .......... 716/11 |
| 2005/0097495 A1 | 5/2005 | Ishiyama |
| 2005/0188339 A1 | 8/2005 | Anderson |
| 2006/0184903 A1 | 8/2006 | Maruyama et al. |
| 2007/0083826 A1 | 4/2007 | Pessetto et al. |
| 2007/0083845 A1 | 4/2007 | Koga et al. |
| 2007/0168888 A1 | 7/2007 | Jawerth |
| 2007/0283308 A1 | 12/2007 | Basu et al. |
| 2008/0005713 A1* | 1/2008 | Singh et al. .......... 716/11 |
| 2008/0066042 A1 | 3/2008 | Archambeault et al. |
| 2008/0118237 A1* | 5/2008 | Wegenkittl et al. .......... 396/76 |
| 2008/0244459 A1 | 10/2008 | Fuchs et al. |
| 2009/0031224 A1* | 1/2009 | Budreau .......... 715/760 |
| 2009/0089669 A1 | 4/2009 | Knowles |
| 2009/0119628 A1 | 5/2009 | Lottmann |
| 2010/0070943 A1 | 3/2010 | Koga et al. |
| 2010/0205575 A1* | 8/2010 | Arora et al. .......... 716/11 |
| 2010/0262993 A1* | 10/2010 | Mizuno .......... 725/38 |
| 2010/0278504 A1* | 11/2010 | Lyons et al. .......... 386/52 |
| 2010/0287515 A1* | 11/2010 | Hedman et al. .......... 716/5 |
| 2011/0050731 A1 | 3/2011 | Chiu et al. |
| 2011/0066997 A1* | 3/2011 | O'Riordan et al. .......... 716/136 |
| 2011/0127429 A1* | 6/2011 | Miyamoto et al. .......... 250/307 |
| 2011/0131525 A1 | 6/2011 | Majumder et al. |
| 2011/0131544 A1 | 6/2011 | Majumder et al. |
| 2011/0141031 A1 | 6/2011 | McCullough et al. |
| 2011/0172110 A1 | 7/2011 | Merriman |
| 2011/0202822 A1* | 8/2011 | Zuckerberg et al. .......... 715/205 |
| 2012/0240052 A1 | 9/2012 | Kazerouni et al. |

FOREIGN PATENT DOCUMENTS

| | | |
|---|---|---|
| JP | 09297700 A | 11/1997 |
| JP | 11095990 A | 4/1999 |
| JP | 11102395 A | 4/1999 |
| JP | 2007109011 A | 4/2007 |
| JP | 2009245177 A | 10/2009 |
| JP | 2009259110 A | 11/2009 |

OTHER PUBLICATIONS

Ekarat Laohavaleeson, Layout Plus Tutorial, CMPE 310, Fall 2006.*

Office Action issued Oct. 10, 2012, in U.S. Appl. No. 12/628,929, filed Dec. 1, 2009.

Office Action issued May 23, 2012, in U.S. Appl. No. 12/628,929, filed Dec. 1, 2009.

Final Office Action issued Apr. 4, 2012, in U.S. Appl. No. 12/628,873, filed Dec. 1, 2009.

Office Action issued Sep. 19, 2012, in U.S. Appl. No. 12/628,873, filed Dec. 1, 2009.

* cited by examiner

VISUALIZATION AND INFORMATION DISPLAY FOR SHAPES IN DISPLAYED GRAPHICAL IMAGES BASED ON A CURSOR

CROSS REFERENCE TO RELATED APPLICATIONS

The present application is related to the following copending U.S. patent applications:

U.S. patent application Ser. No. 12/268,873, entitled "Visualization and Information Display for Shapes in Displayed Graphical Images," filed on even date herewith and assigned to the assignee of the present invention; and U.S. patent application Ser. No. 12/628,929, entitled "Visualization and Information Display for Shapes in Displayed Graphical Images Based on User Zone of Focus," filed on even date herewith and assigned to the assignee of the present invention.

FIELD OF THE INVENTION

The present invention relates to graphical display by computer systems, and more particularly to displaying graphical and descriptive information using a computer system.

BACKGROUND OF THE INVENTION

Computer-enabled graphical display and editing systems are used in a wide variety of different applications and industries to view and edit different types of visual images on computer systems or other electronic devices. One common application is electronic design automation, including such applications as layout design, in which the designs for components and spatial layout of electronic components such as integrated circuits and circuit boards are viewed, created and edited using displayed images in graphical software applications.

Custom layout design involves rapid manual activity of a designer, where productivity is the key. Improvements in designer productivity, especially involving the more repetitive activities, lead to substantial decrease in design turnaround-time and increase in user satisfaction.

When using existing layout editors, designers often "lose touch" with the layout, i.e. lose their place or context within the layout, during a variety of common tasks. For example, when a designer performs zooming operations in or out to change the displayed magnification level of a layout portion or other image, the designer may lose context and must rely on quick identification of familiar or known shapes to regain context. Such zoom operations are performed frequently during editing, which further causes a designer to lose track of particular locations and areas on a design canvas. Similarly, when a designer pans a view of the layout, the same loss of context may occur. Or, a designer may perform focused and concentrated edits in a smaller area of the layout for a long time, and may lose the connectivity context of the surrounding topology as a result. Furthermore, when a designer is inspecting and editing a new design or another person's design, getting a grasp of the connectivity takes a long time, thereby reducing productivity. Similarly, graphical interfaces and systems for other applications also commonly cause a user to lose context when editing and viewing different features in an image.

In one example of designer loss of context through editing, FIGS. 1-4 show a graphical interface for an application that is used to view and edit circuit layouts, the graphical interface including a displayed interface 10 and image 12 graphically depicting a portion of a layout design. In this example, the user has turned off other layers so that only one layer of components is displayed. From the initial view of the layout in FIG. 1, the user must perform some corrections in the lower right corner area which includes some dense routing and flattened standard cells. In one example, the modifications can be meant for shapes in netlists net-A and net-C (textual lists and configurations of components) based on a report in a log of Layout Versus Schematic (LVS) software, on an M1 metal layer, where the designer wishes to edit the graphical layout so that it matches the items in the netlists. To more easily perform the desired corrections, the user zooms in to the magnification display level shown in FIG. 2. At this magnification level, however, the designer may become disoriented due to the different view. This disorientation is usually even more common when working on a new design or other person's design.

To regain context, the designer can search for known landmarks or shapes, such as the U-turn shape 14 which may indicate the location of the layout. Some applications allow the designer to click or select one or more of the displayed layout shapes to display information about the selected shapes, or may allow the designer to query the connectivity, such as a text-based netlist showing the connections of the shapes in a design, to make sure the displayed location is the desired location in the layout and to avoid making errors.

FIG. 3 shows a view of the interface display after the user has performed another zoom operation relative to the display of FIG. 2. As is common, the zoom operation did not occur as precisely as the designer expected, and the displayed area is a small distance to the right, left, up, or down of the location intended to be worked on. Furthermore, the familiar landmarks such as the U-turn shape 14 of FIG. 2, which would allow the designer to regain the layout context, are no longer fully in view. Thus the user has to perform additional zooms, pans, and/or queries to move the displayed area to the desired location, shown in FIG. 4.

The loss of context in a displayed region is even more common for cell layout designs in which there are many repeating patterns, as in the examples of FIGS. 1-4. In such cases, the designer may recognize landmarks or other shapes, but cannot be sure he or she is viewing the desired location due to the repeating patterns and similar shapes present all throughout the layout. Thus, the designer needs to query the connectivity of shapes to ensure the desired location is displayed. This process would then repeat when the designer completed desired edits and needs to display a different location of the layout. The task of regaining context is even more difficult if the layout does not include manual labels of the components, as in the example of FIG. 1.

A layout designer may perform such zooming tasks and attempts to regain context as much as 200 times a day, or more during rigorous design phases. Much of the time is spent maintaining context and identifying connectivity in a layout. Furthermore, when working on a new or other person's layout, it can take a long time before the designer is familiar enough with the layout and its connectivity. All these factors lead to repetitive, tedious tasks for the user that decrease productivity substantially.

As described above, in existing layout systems, there are generally two ways that systems allow a designer to maintain context. One way is to provide a query system and rely on the designer's intent, where the designer can query a shape or other displayed feature when the designer desires to learn more about the context. The problem with this method is that the designer is required to perform an explicit activity to find out the current context on the layout, and in every instance of re-establishing context, the query activity must be performed many times on multiple displayed shapes, which is burdensome and time-consuming for the designer. Another way to maintain context is to allow the designer to manually add displayed labels on the layout which allow the designer to continue to view the labels and track context more effectively. Some designers add identifiers other than labels on shapes to provide reminders, such as marking an area with a ruler or other icon to indicate that further edits need to be made at that area. Such labeling is worthwhile to later allow designers to easily recognize details of the design. For example, a layout engineer should spend time adding labels to a layout so that a different designer does not face as much difficulty working with the layout in the future, similar to the practice of adding comments to software code. However, the labeling task can be very time consuming and burdensome as well, especially when adding labels to many shapes on a canvas to allow context to be maintained in most situations.

SUMMARY OF THE INVENTION

The inventions of the present application relate to graphical viewing of shapes and descriptive information in a displayed image. In one aspect of the invention, a method for displaying shape information in a graphical interface using a computer system includes causing a display of an image on a display device, where one or more shapes are displayed in the image. The method causes a display of a cursor on the display device, the displayed position of the cursor being controlled by a user of the graphical interface using an input device. The method causes a display of a plurality of labels on the display device, each of the labels associated with a different one of the displayed shapes. The plurality of labels are displayed within a predetermined zone relative to a displayed cursor, and wherein no labels are displayed outside of the zone. A similar aspect is provided for a computer program product comprising a computer readable medium including program instructions for implementing similar features, and for a system providing similar features.

The present inventions allow a user to work within a graphical interface and image to view and edit displayed shapes by viewing descriptive information for the shapes relative to a displayed cursor and thereby increase and maintain the user's awareness of the user's context within the image, leading to greater design efficiency and user satisfaction.

DETAILED DESCRIPTION

Figure 1:
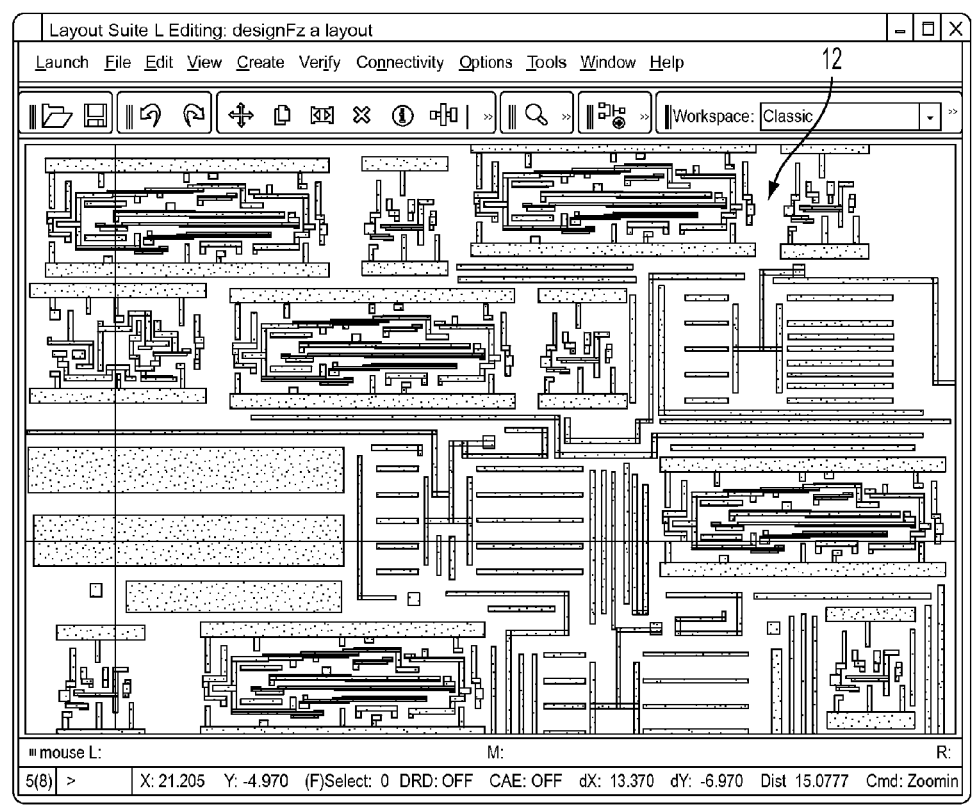
FIGS. 1-4 are diagrammatic illustrations of a graphical interface for viewing and editing circuit layouts, shown at different zoom magnification display levels.
Figure 2:
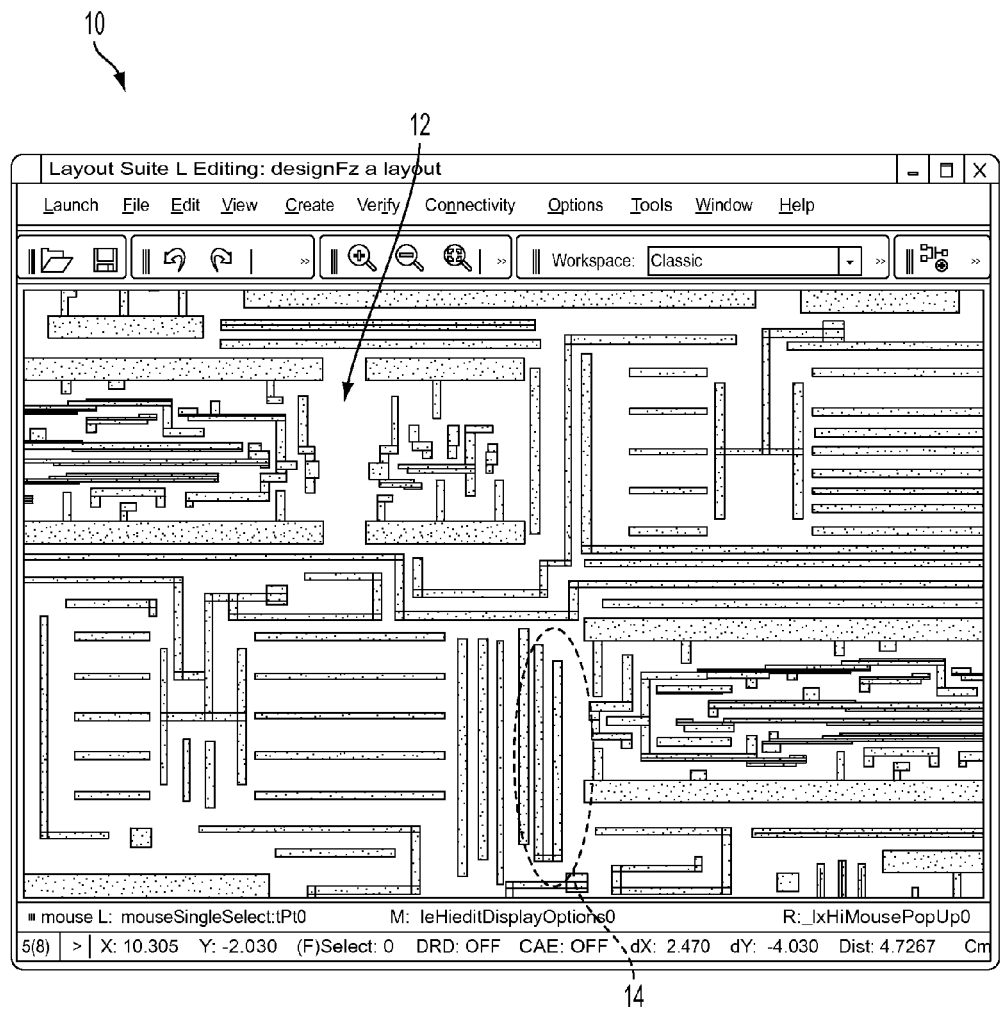
Figure 3:
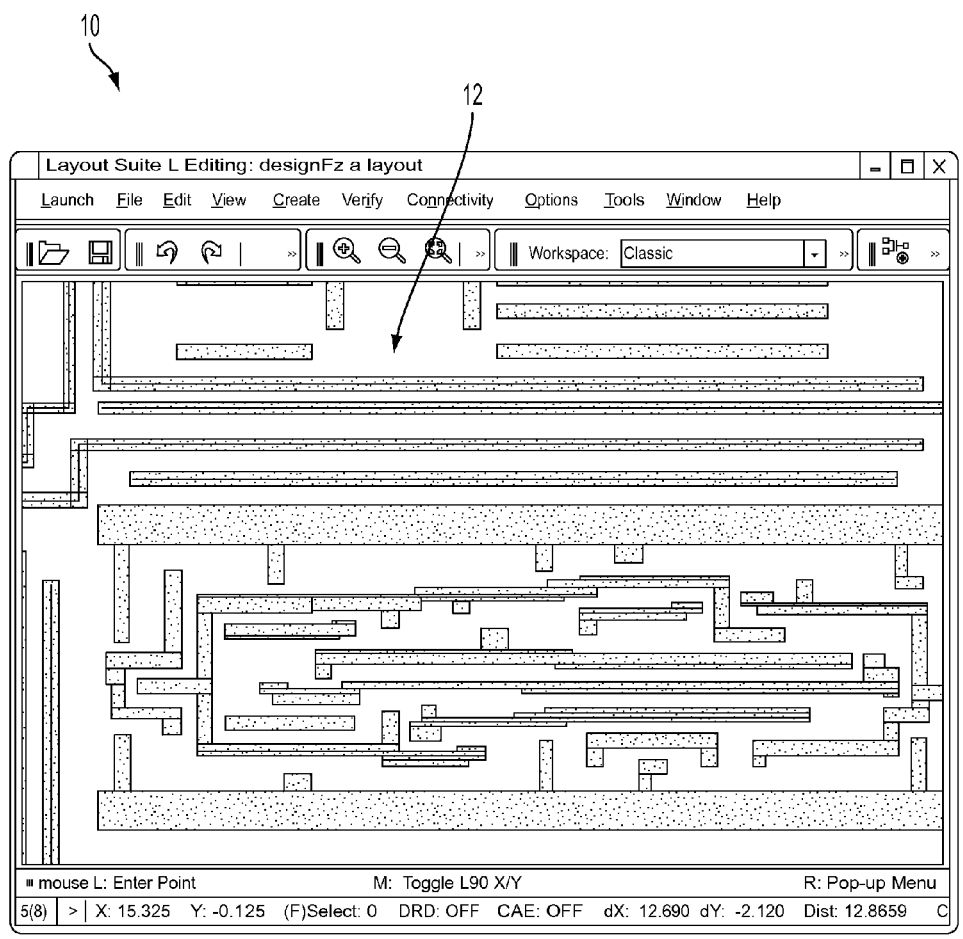
Figure 4:
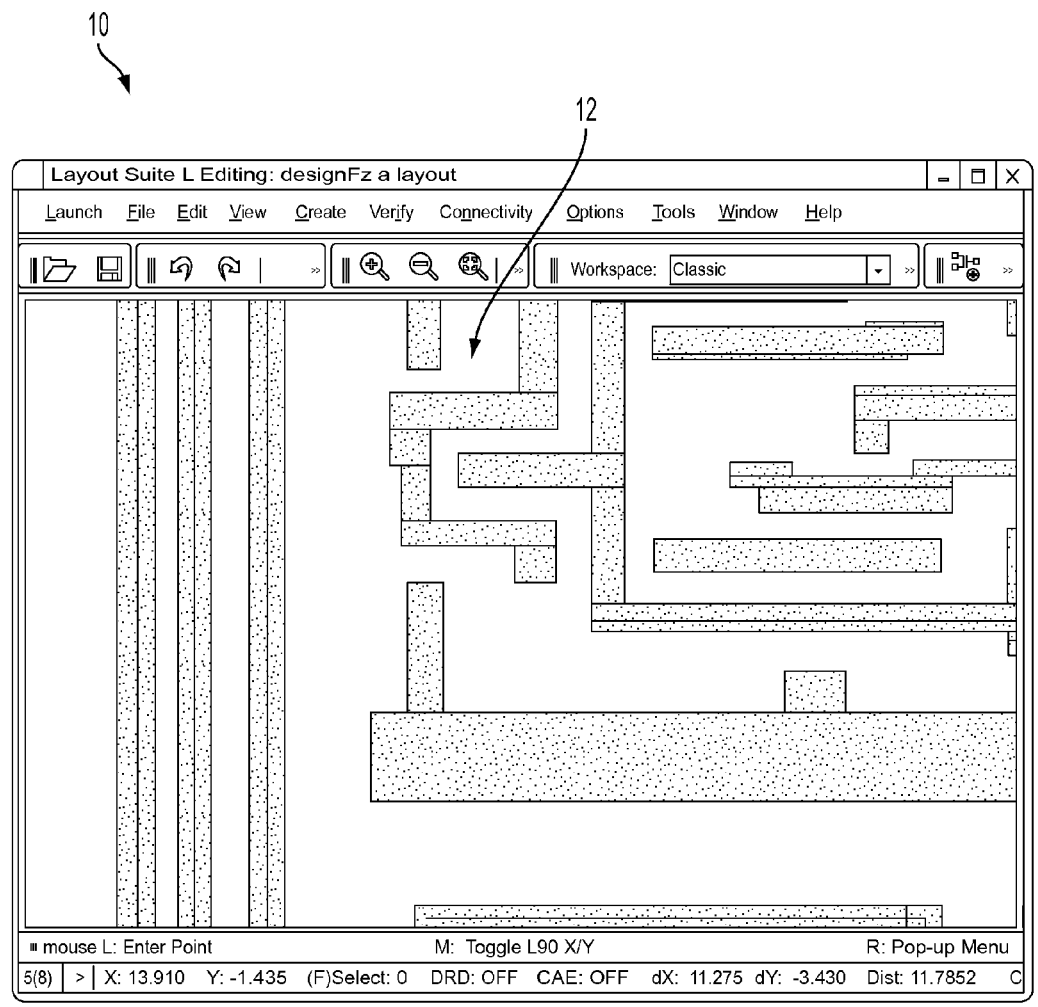

The present inventions relate to graphical display by computer systems, and more particularly to displaying graphical and descriptive information using a computer system. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is mainly described in terms of particular methods and systems provided in particular implementations. However, one of ordinary skill in the art will readily recognize that these methods and systems will operate effectively in other implementations. For example, the system implementations usable with the present invention can take a number of different forms. The present invention will also be described in the context of particular methods having certain steps. However, the method and system operate effectively for other methods having different and/or additional steps not inconsistent with the present invention.

The inventions herein can take the form of a software embodiment, a hardware embodiment, or an embodiment containing both hardware and software elements. A software embodiment can include but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk read only memory (CD-ROM), compact disk read/write (CD-R/W) and DVD.

The present inventions allow accurate visualization of features such as shapes in displayed images by displaying descriptive information for shapes, promoting greater efficiency and productivity. The inventions allow users to maintain context when zooming or panning their view around a canvas or image by referring to the displayed descriptive information that helps identify their viewed locations in reference to previously-displayed views. Furthermore, a user can establish and maintain context more easily when working on a different person's design. This is all accomplished with relatively little extra input or time required from the user.

To more particularly describe the features of the present invention, please refer to FIGS. 5-19 in conjunction with the discussion below.

Figure 5:
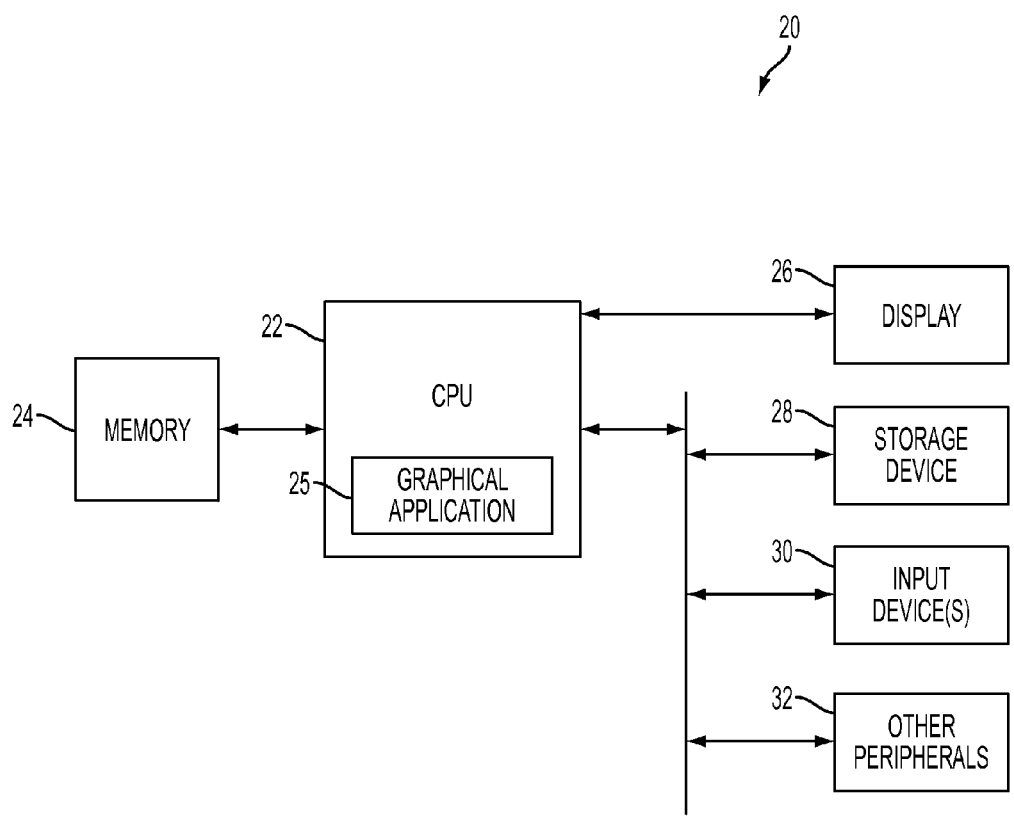
FIG. 5 is a block diagram illustrating a system suitable for use with the present invention.

FIG. 5 is a block diagram illustrating a system 20 suitable for use with the present invention. System 20 can be any suitable computer system, server, or other electronic or hardware device. For example, the system 20 can be a mainframe computer, desktop computer, workstation, portable computer, or electronic device (set-top box, portable device, cell phone, personal digital assistant, media player, game device, etc.). System 20 includes a CPU 22, memory 24, display device 26, storage device 30, input device(s) 32, and other peripherals 34.

CPU 22 can be one or more microprocessors or other processors to execute program code and control basic operations of the system 20, including processing operations, manipulating data, issuing commands to other components of the system 20, etc. For example, an operating system can run on the system 20 and is implemented by the microprocessor 22 and other components of the system 20. CPU 22 can also implement graphical editing software 25 of the present invention, as described further below.

Memory 24 is typically provided in system 20 for access by the CPU 22, and can include one or more of a variety of types, such as random access memory (RAM), read-only memory (ROM), Electrical Erasable Read-only Memory (EEPROM), Flash memory, etc.

Display device 26 outputs displayed images to a user of the system 20. Display device 26 can be any of a variety of types of displays, including LCD, Plasma, CRT, etc. Some implementations of the display device 26 include a screen having a screen size, e.g., an area within which images are displayed. In some embodiments, the CPU 22, and/or a different processor in communication with the display device, can cause the display of images on the display device by providing the appropriate signals to well-known components of system 20 used in displaying images on device 26. Storage device 28 can store data that may be retrieved by the CPU (including program instructions and/or data for graphical editing software 25), and can be any of a variety of devices such as a hard disk, CD-ROM, DVD-ROM, Blu-Ray disc, magnetic tape, etc. Input devices 32 can include any of a variety of devices that allow users to input commands and data to the CPU, including a keyboard, mouse, trackball, stylus, touchscreen, microphone/voice recognition device, motion sensors, other electronic device (such as another computer system or portable electronic device), or other input device. Other peripherals 34 can include any other devices connected to and used by the system 20, such as any peripheral, card, or interface device that performs one or more functions and communicates with the system 20, such as network adapters that enable the system 20 to become coupled to other computer systems or devices through intervening private or public networks, scanners, printers, sensors, speakers, etc. In the example of FIG. 5, the display device 26 is connected to the CPU 22 by its own dedicated bus, while storage device 28, input devices 32, and other peripherals 34 are connected to a common bus that is also connected to the CPU. In other embodiments, the display device 26 and other devices can each have their own bus, or share one or more common buses. One or more of the buses or other links can be implemented using wires or wirelessly, according to any of well known standards and protocols.

The graphical editing application 25 and interface of the present inventions can be implemented by the CPU 22 (or other processor) to cause the display of one or more images and/or interface on the display device 26 and receive input from one or more of the input devices 32 to control the functions of the application and interface. The software 25 can also be stored on storage device 30 and/or in memory 24. Some of the functionality of software 25 is described in greater detail below.

Figure 6:
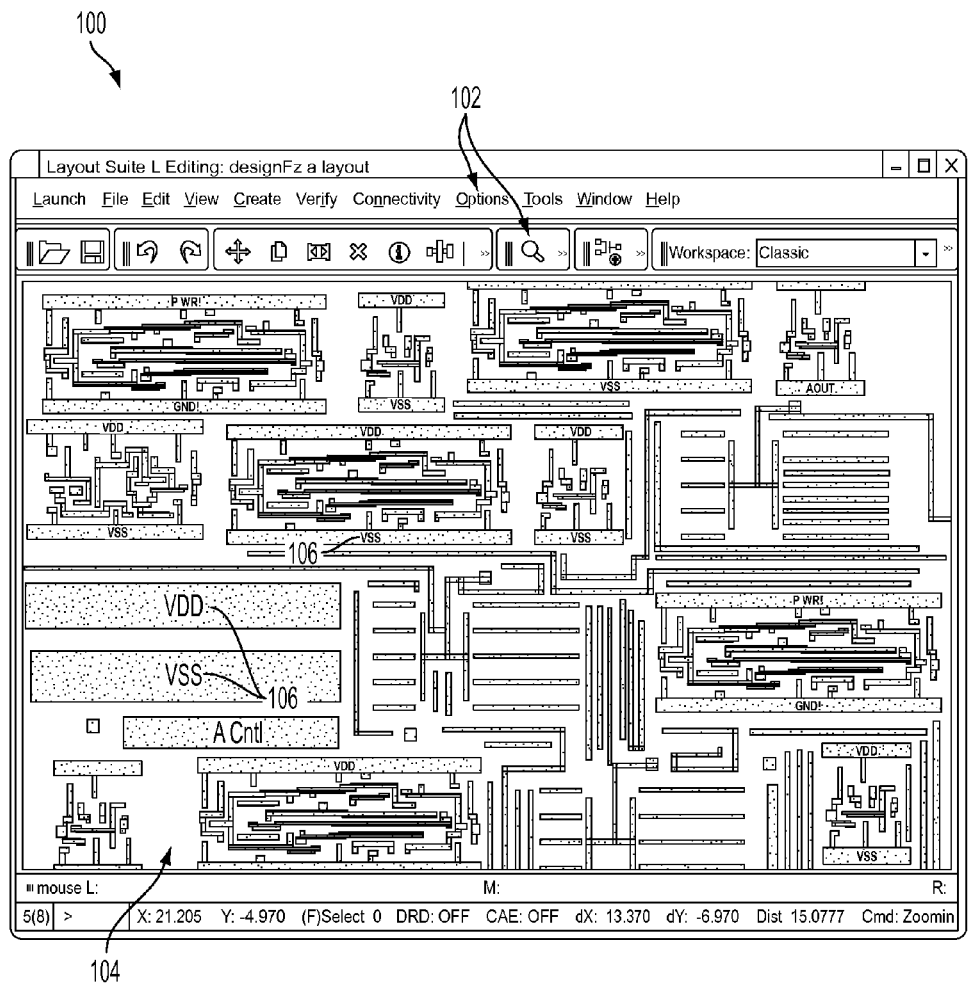
FIG. 6 is a diagrammatic illustration of an example embodiment of a graphical interface for a viewing and editing application and displayed image of a layout canvas suitable for use with the present invention.

FIG. 6 is a diagrammatic illustration of illustrating an example embodiment 100 of a graphical interface for a viewing and editing application 25 suitable for use with the present invention, including a displayed interface and image. The interface is shown as a displayed window within a graphical user interface, but can be displayed in other forms in other interfaces. In the displayed interface 100, various controls 102 are displayed such as menu items and buttons which allow the user to select various viewing and editing functions of the application and interface 100.

The interface 100 also displays a main image 104 which is created and/or edited by the user with functions of the interface 100. The image 104 displayed in the interface 100 can be part of a complete, larger image or "canvas" (i.e., displayable or editable work area, or complete set of data of interest to the user) that is stored in the memory 24 or other data storage of the system 20, where only part of the complete canvas is displayed in the interface 100 at one time. Alternatively, or at other zoom levels, the image 104 can be the complete canvas. For example, after selecting a zoom function of the interface 100, the canvas is displayed at a lower level, i.e., zoomed in so that the details of the image 104 are displayed larger. After a sufficient degree of zoom-in, only part of the canvas is displayed in the interface 100 as image 104.

In the example embodiments shown herein, a layout design application is being used on system 20 and provides the interface 100. This application allows designers to create and edit layouts for integrated circuits, circuit boards, or other electronic designs (and may have many other functions, not detailed here). For example, the layout design application of interface 100 displays an image 104 which can be the entire layout or canvas for the layout design, or only a displayed part of the canvas, and which depicts an integrated circuit layout displayed having various graphical "shapes" that represent various components such as electrical traces, vias for connecting different layers, and/or other electronic components. The user can create, add, delete, or modify the shapes in the image 104 and canvas, which in some embodiments can modify a data model of these components that corresponds to the displayed images. However, many other different applications and programs can be used with the inventions described herein. For example, schematics viewing and editing, as well as editing and viewing of other graphical images, maps, plans, or diagrams, can be suitable for use with the present inventions.

In other embodiments, other types of images can be displayed in interface 100 for other applications instead of layout design. For example, line drawings, graphical shapes, photo images, maps, or other images can be displayed, created and/or edited similarly to the layout image 104 described above. Such other embodiments and applications also may use one or more labeling embodiments described herein and thus can also benefit from the present inventions.

In the example of FIG. 6, a graphical layout of a circuit is displayed at a particular zoom level showing a portion of the layout. In this example, the "connectivity" of the layout has been specified and is known by the application software, i.e. the software has recorded how each shape of the canvas (or alternatively, a subset of the shapes) is connected to the other shapes of the canvas, and in some embodiments knows the types, functions, and/or other characteristics of the shapes. The connectivity can be represented using connectivity information in any desired form, which in general identifies the shapes and describes or represents electrical connectivity of the shapes, can be stored in any available storage device such as memory, hard disk, etc. For example, the connectivity information can be stored as, or in, a connectivity information database from which shapes (and/or other components) and their connections are referenced and retrieved. In some embodiments, the connectivity information can take the form of a netlist showing connections and/or other relationships between identified shapes. Thus, in a typical embodiment, each of the shapes has a designated label used for identifying the shape, as well as known connectivity to any other components that the shape is connected to, specified as connections having identifier labels and identifying other components which the connections are connected to.

A netlist is a textual representation of a circuit design. One example of a netlist is shown below, in the format of the SPICE (Simulation Program with Integrated Circuit Emphasis) language, for an instrumentation amplifier:

```
v1 1 0
rstab1 1 0 9e12
v2 4 0 dc 5
rstab2 4 0 9e12
e1 3 0 1 2 999k
e2 6 0 4 5 999k
e3 9 0 8 7 999k
rload 9 0 10k
r1 2 3 10k
rgain 2 5 10k
r2 5 6 10k
r3 3 7 10k
r4 7 9 10k
r5 6 8 10k
r6 8 0 10k
.dc v1 0 10 1
.print dc v(9) v(3,6)
.end
```

Identifiers identify elements of the circuit. For example, v1 and v2 are voltage supplies; e1, e2 and e3 are dependent voltage sources or op amps; rstab, rload, rgain, r1 -r6 are resistors; and text lines preceded by a period (.) are commands. The numbers following each element identifier are the connectivity information, i.e. identifications of connection nodes in the circuit, showing how each element is connected to the circuit. The connectivity information is followed by any values for the identified element (such as ohms for resistors).

According to one aspect of the present invention that allows a user to maintain context relative to the shapes displayed on the canvas, some of the shapes in image 104 are labeled with labels 106. The content of these labels has previously been stored as connectivity information for use in determining the connectivity of the shapes of the integrated circuit layout, e.g., previously used for modeling circuit behavior, checking connections in connection tests, and the like. For example, the graphical editing application 25 can be "connectivity aware," in which the software knows a label and connectivity of each shape of the canvas stored on a storage device.

Thus, one or more of the shapes (or other objects) of the canvas are each associated with a label that identifies the shape itself and/or other characteristics of the shape, such as its connectivity. According to the present invention, one or more labels are displayed on the screen in association with their shapes. As used herein, the term "label" or "auto-label" can indicate any identifier for a shape displayed on the screen. For example, FIG. 6 shows labels indicating the connectivity of the shapes (which are metal traces) shown on the canvas on a metal layer of an integrated circuit. Thus, a label of "VDD" is provided for each shape electrically connected to the VDD power terminal, while a label of "A_Cntl" indicates that the associated shape is connected to the A_Cntl signal used in the circuit. The example of FIG. 6 shows labels that are text labels having text characters, but labels can also or alternatively be displayed as icons, symbols, picture images, signs, shapes, animated images, or other indicators in other embodiments. One or more labels can also be displayed for a group of shapes (such as an object), or other constructs used within the graphical design application.

According to the present invention, some or all of the labels associated with displayed shapes are automatically displayed in the image 104 as "auto-labels" in an auto-labeling feature. The labels are retrieved from the stored connectivity information and displayed on the appropriate associated shapes displayed on the screen. This assists the user in visualizing the layout and shapes, as well as maintaining context within the layout, since the user can identify shapes and/or characteristics of those shapes by their displayed labels. Furthermore, since existing connectivity information is used to provide the labels, the user does not have to manually input any labels on particular shapes. Previous software, in contrast, did not display any labels based on connectivity information, and required the user to manually input labels on shapes, one shape at a time, which was time consuming and tedious.

In some embodiments of the invention, some or all of the shapes of the image 104 are associated with labels, but only some of the shapes that are associated with labels actually have their labels displayed, as shown in FIG. 6, as a dynamic auto-labeling feature. The particular labels that are actually displayed is based on the current zoom level of the canvas and the resulting size of the shapes in image 104, i.e., a label is displayed based on the current display size of the shape associated with the label. If a shape (or portion of a shape) is displayed having a physical displayed size (relative to the dimensions of the display) above a threshold display label size, then the label for that shape is automatically displayed. A label can be displayed on its associated shape, e.g. centered on the shape as shown in FIG. 6, or alternatively displayed near the shape or displayed as to indicate its association with the shape (e.g., having a line or arrow drawn from the label to the shape, etc.).

The threshold label display size can be determined based on different factors. In one embodiment, it can be based on the fact that the average human eye can easily read a text height of 2-3 mm or more. This size can be converted to a number of pixels displayed on the display device 26. For example, if a displayed shape has a width equivalent to, or larger, than 3 mm, the label is automatically displayed for that shape. Thus, for example, as zoom magnification level increases for the image 104 displayed in the interface 100, some shapes previously too small to be displayed with labels may then be displayed over the threshold label display size in the new magnification level, and the labels would automatically be displayed for those shapes. If the zoom magnification level decreases for the image, then some shapes previously large enough to be displayed with labels may then be under the threshold size and so the labels would automatically no longer be displayed for those shapes. The threshold size can be different in various embodiments, and can be user-controlled or administrator-controlled. Furthermore, the threshold size can be based on the displayed width of a shape, or the displayed height, area, or other desired one or more dimensions of the shape.

This selective auto-labeling feature allows a user to see labels for larger shapes, but not have the screen cluttered with labels for small shapes, which in most layouts would be too confusing due to the large number of shapes. The user can identify smaller unlabeled shapes by zooming the image 104 to a higher magnification level at which the interested shapes are large enough in size to have their labels displayed.

Figure 7:
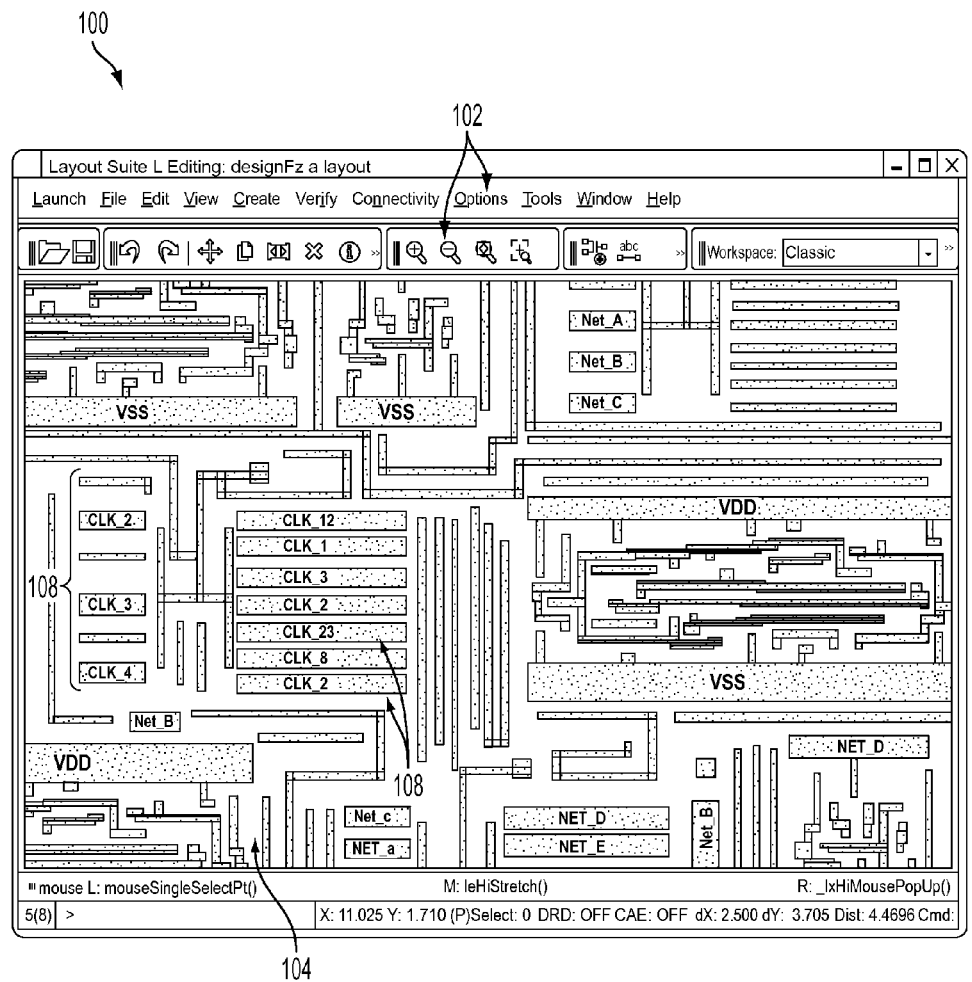
FIG. 7 is a diagrammatic illustration of the layout canvas of FIG. 6 displayed at a higher zoom magnification level.
Figure 8:
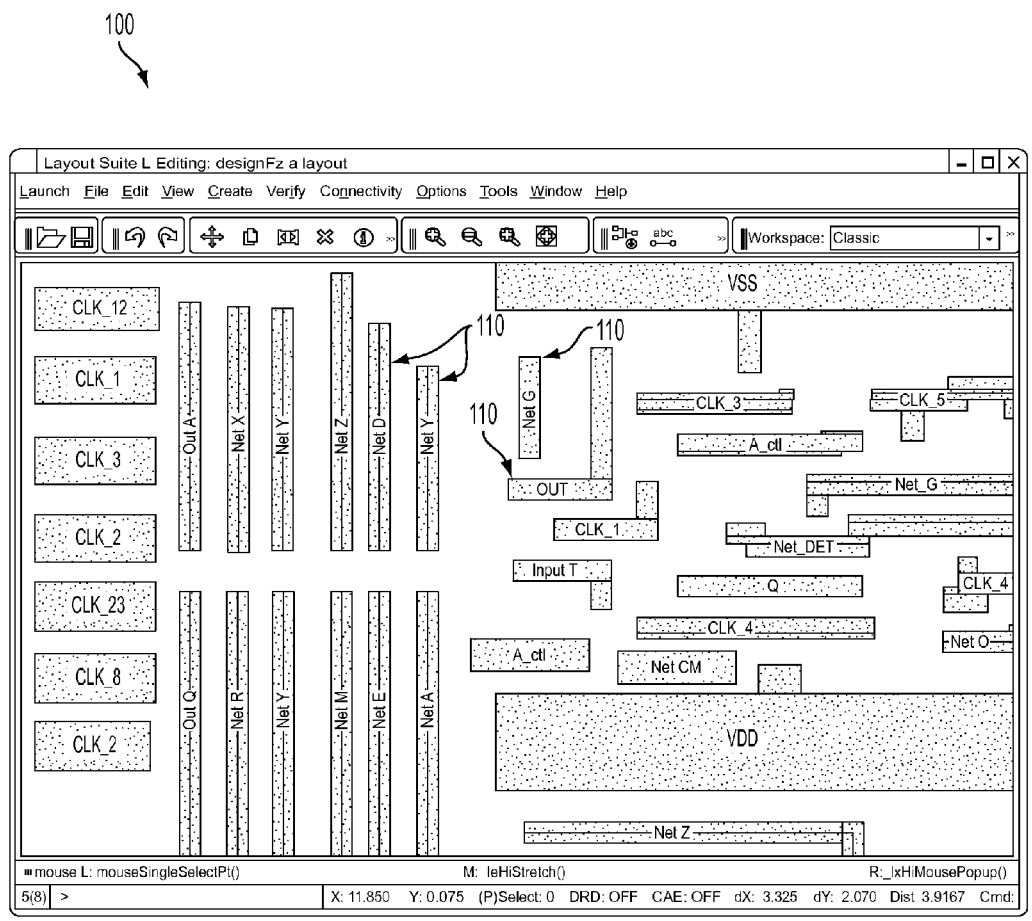
FIG. 8 shows another view of the layout canvas of FIGS. 6-7, in which the canvas has been zoomed to a higher magnification level.

An example of the connectivity-aware auto labeling is shown in FIG. 7, which shows the image 104 of FIG. 6 but at a closer (higher) zoom magnification level. The shapes are shown at a larger size than at the zoom level of FIG. 6, and several of the shapes have become large enough to have a size over the threshold label display size, and thus now have their associated labels displayed, including the CLK signal trace labels 108, which were not displayed in the view of FIG. 6. FIG. 8 shows another view of the canvas, in which the image 104 has been zoomed to a higher magnification level than the image 104 of FIG. 7, and several additional labels such as the OUT and NET labels 110 are now displayed because their associated shapes have a sufficiently large displayed size at the higher magnification level.

In different embodiments, the displayed labels can be displayed all at a constant, standard size, or they can be displayed at varying sizes. In some embodiments, the labels can be displayed at a size proportional to the height, or width, of their associated shapes. For example, as shown in FIG. 7, the labels for the VSS and VDD shapes are displayed larger (e.g. a larger font size, or a larger height of characters) than the labels for smaller shapes such as CLK shapes 108.

The auto labeling of the present invention allows the user to maintain his or her context by displaying labels on shapes for user reference. The user may have zoomed, panned, and/or be working on an unfamiliar layout, and the user is always informed of the connectivity topology in the area that he or she is working. The user does not need to search for and manually identify landmarks or known/recognized shapes to determine the current location. Furthermore, the automatic label display or removal based on shape size threshold prevents user confusion caused by the cluttering of the canvas of too many labels or too large labels that obscure their associated shapes, yet appropriately displays labels at appropriate sizes automatically to assist the user in maintaining context.

Figure 9:
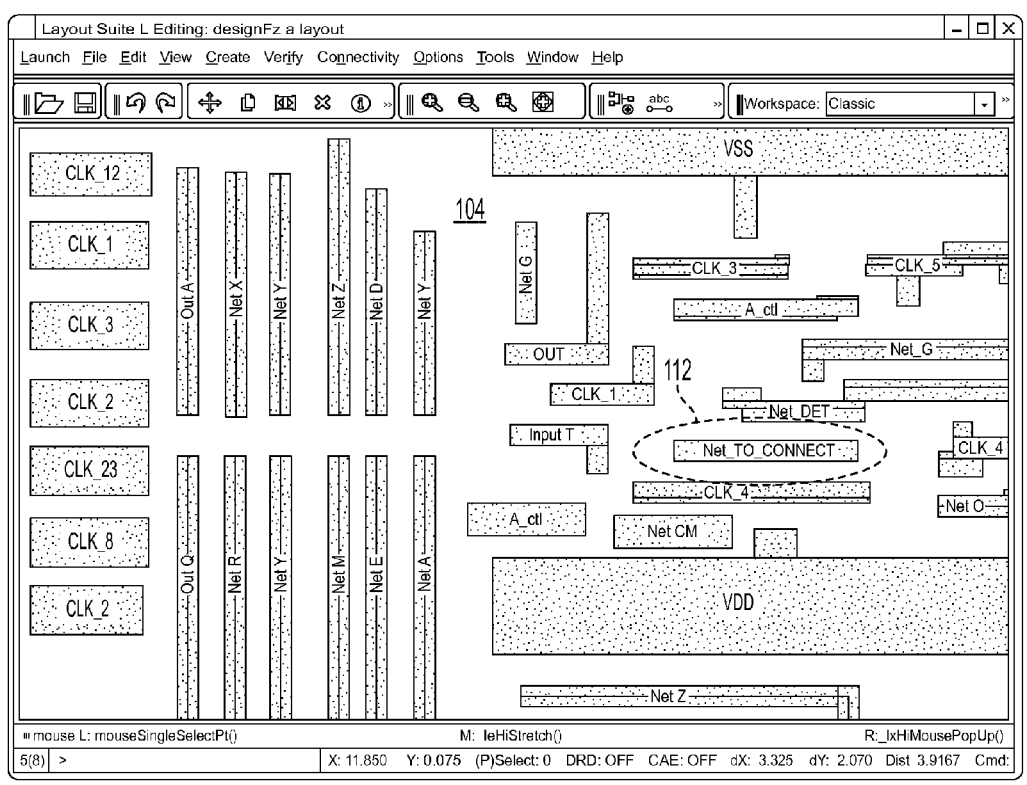
FIGS. 9-12 are a diagrammatic illustrations of another embodiment of the present invention in which the user can place marker identifiers on the displayed image.

FIG. 9 is a diagrammatic illustration of another embodiment of the present invention, in which the user can place marker identifiers on the displayed image 104 to assist in maintaining context. This embodiment can also be useful in conjunction with the auto-labeling embodiments described above in connection with FIGS. 6-8. In FIG. 9, the user is zoomed in, reviewing the shape labels, and is planning to edit a particular shape. For example, the user plans to add a wire connection and terminate the connection on net shape 112, labeled "Net_TO_CONNECT." To plan this task, the user needs to zoom out to see the starting point for the wire connection, to analyze the topology of the layout, and to decide on the particular path of the route. However, in the auto-labeling embodiment described above, zooming out the view will cause many of the displayed shapes to become a smaller size than the threshold label display size, and so many of the displayed labels will be removed. This can cause the user to lose the context, by losing the location of the termination or destination point of the wire connection. The user would then have to figure out the desired locations all over again when starting the route planning.

Figure 10:
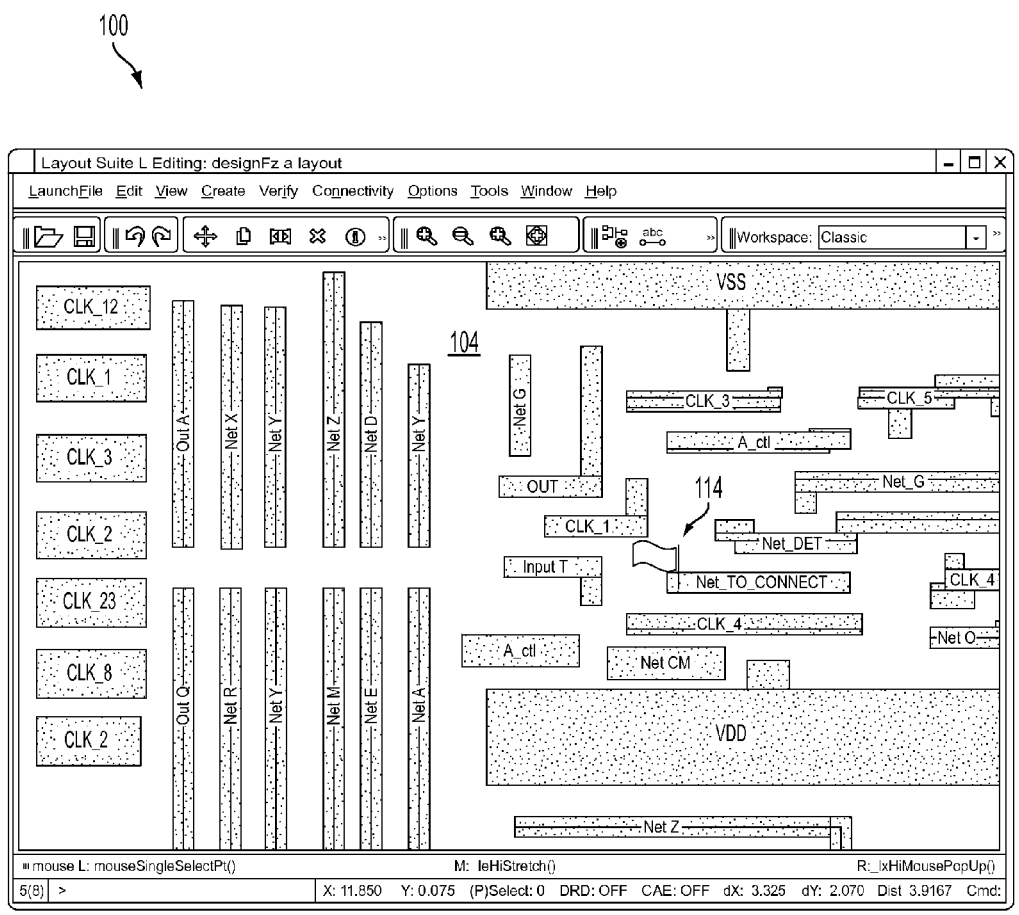

To allow a user to maintain context despite the removal of labels of shapes when zooming out, this embodiment allows a user to create an marker identifier on a desired shape or location of the canvas. FIG. 10 shows a particular marker that the user has placed on the displayed canvas in the shape of a flag 114. The user can place the marker 114 using standard interface actions and menus, such as right-clicking on the desired shape or location using a pointing device, selecting a shape or area and inputting a command, etc. Other symbols or shapes can be displayed as markers in other embodiments.

Figure 11:
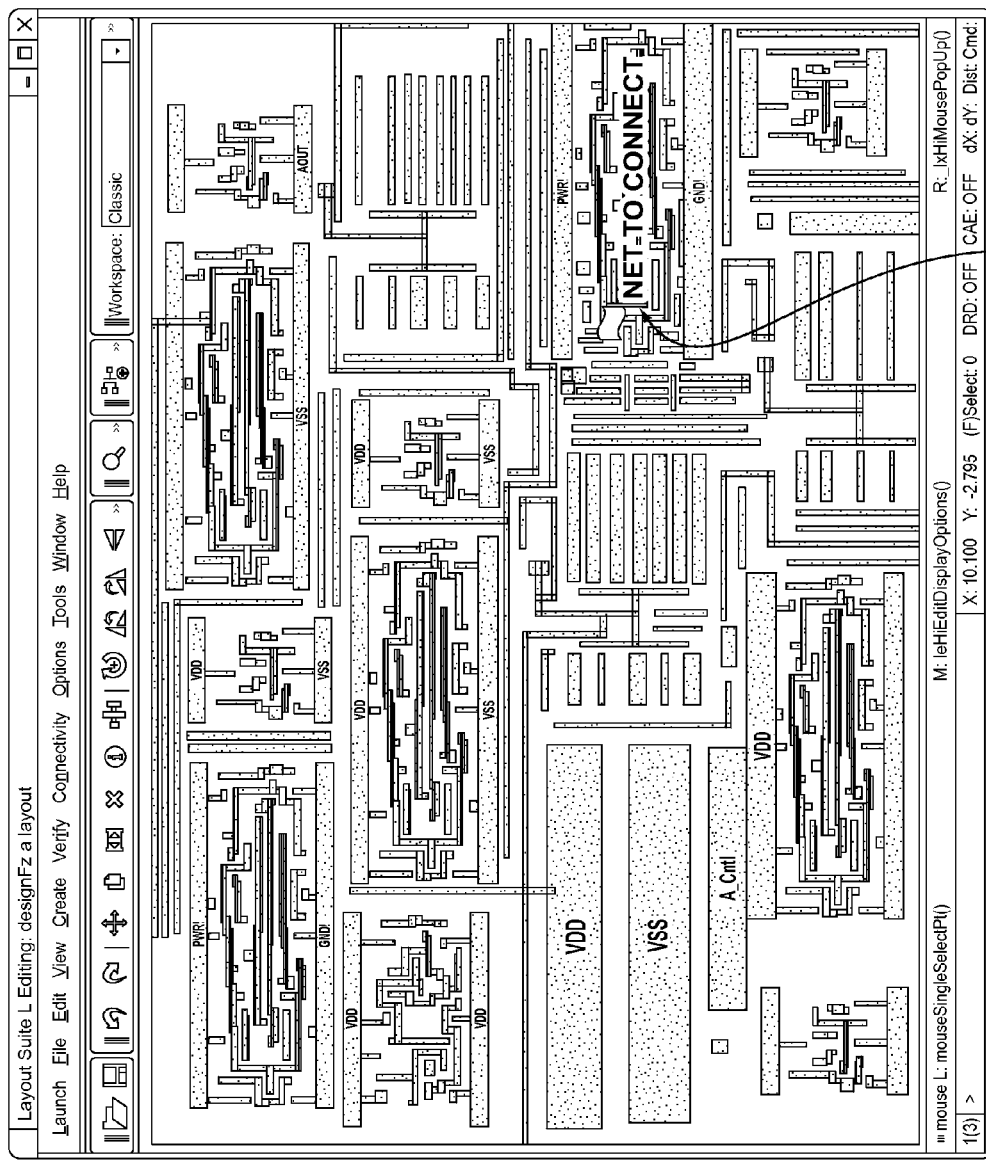

FIG. 11 shows the display of FIG. 10 after the view has been zoomed out by the user. Many of the auto-labels have been removed from the display, but the flag marker 114 is always displayed, regardless of shape display size or zoom/ magnification level. Furthermore, in some embodiments the label of the shape having the flag marker 114 can also always be displayed, as shown in FIG. 11, regardless of the displayed size of the shape or the zoom/magnification level. The marker 114 indicates to the user from a very high zoom level the location that the user intends to edit or view, and so the user retains the context that was present when zoomed in to a higher magnification.

In some embodiments, multiple markers 114 can be created by the user and placed on different shapes or locations that are of importance to the user for editing or which are important for maintaining context. For example, the user can perform multiple zoom operations at different locations on the canvas, examine the auto-labels at the desired zoom magnification levels and determine which shapes are currently relevant to editing or viewing, and mark these shapes with markers 114.

Figure 12:
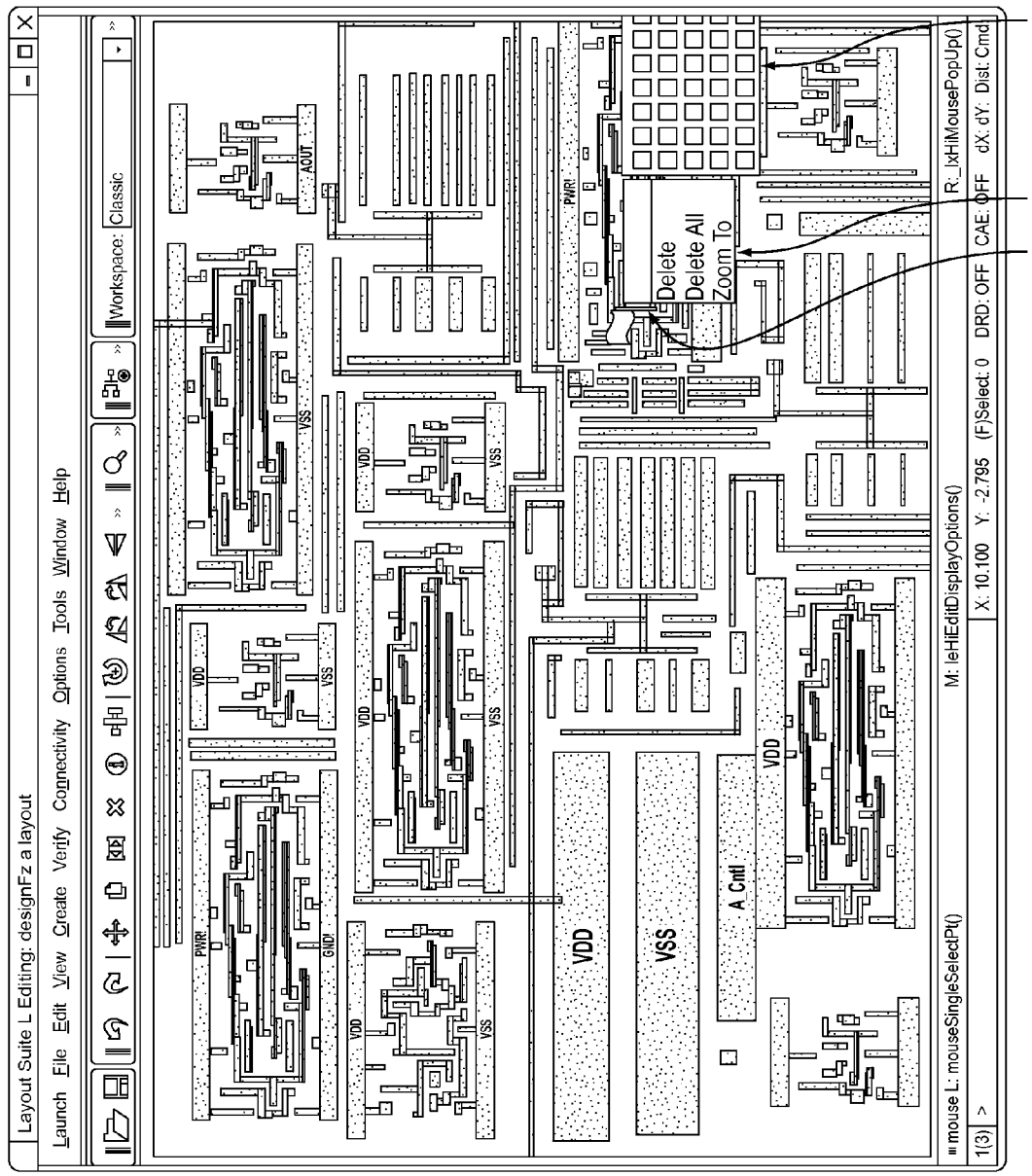

Each of the markers 114 can be the same appearance or different appearance, or have labels to distinguish them from each other. FIG. 12 shows one example of an embodiment of the marker 114, in which a flag color can be chosen the user. A menu 120 can be displayed based on a command input by the user, e.g., a right-click of a pointing device button, activation of a control or menu 112 in the interface, etc. The "Delete" option in the menu 120 allows the user to delete the flag marker 114, and the "Delete All" option allows the user to delete all flag markers 114 currently placed on the canvas (or, alternatively, all flag markers 114 currently displayed in image 104). The "Zoom To" option allows the user to zoom the view of the canvas in or out by a predetermined amount centered on the flag marker 114. In alternate embodiments, further options can be provided for markers 114, such as prompts for the user to input a particular magnification level to which to zoom to or an option to select a different marker name to move the displayed view to the corresponding flag marker on the canvas. Other commands can also be implemented, such as the user double-clicking or otherwise selecting the marker 114 to zoom the view closer to the shape associated with the marker 114. The top of the menu 120 shows the current display color of the flag marker 114. A color menu 122 displayed next to the menu 120 (or alternatively at some different location) allows the user to select one of the shown color items in the menu 120 to change the color of the marker 114 to a color of the color item.

Cursor-Controlled Label Zone

Figure 13:
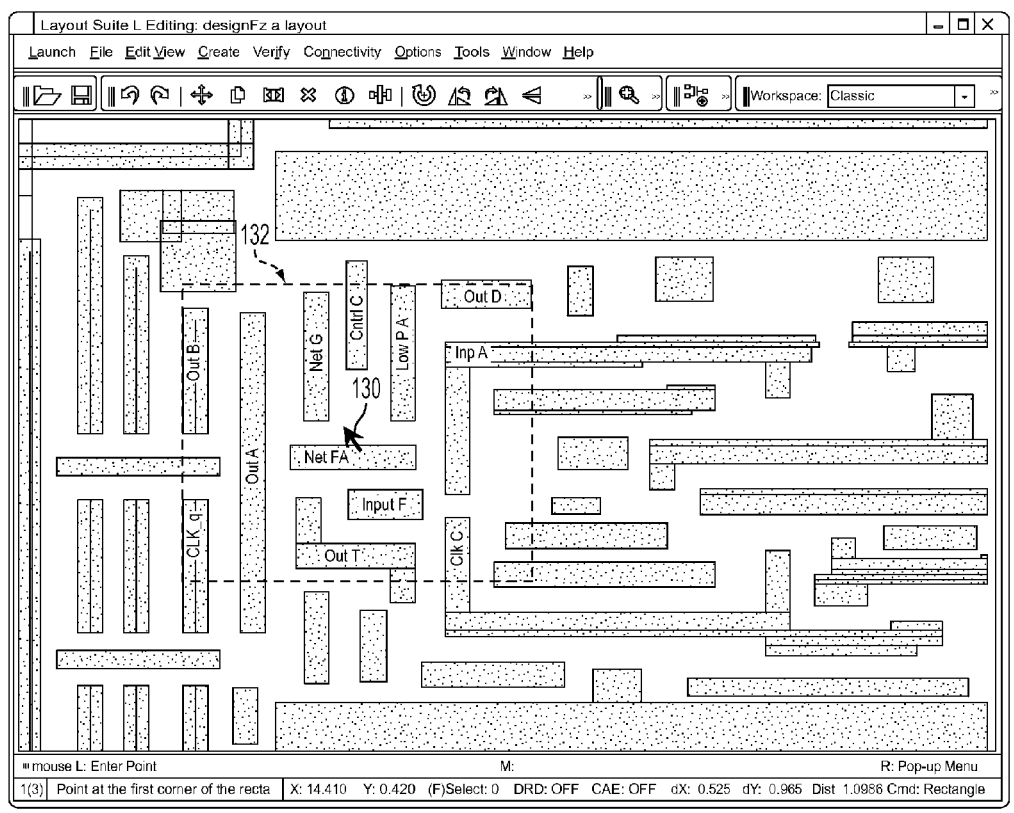
FIGS. 13 and 14 are diagrammatic illustrations of another embodiment of the present invention, in which the user can influence auto-labeling of the present invention using a cursor.

FIG. 13 is a diagrammatic illustration of another embodiment of the present invention, in which the user can influence auto-labeling of the present invention using a cursor. In this embodiment, the user controls the movement of a cursor (which can be a pointer, arrow, text cursor, other any other displayed indicator) using a pointing device or other input device 20, to input commands to the design application, select shapes, objects, or areas of the image 104, etc. If the user does not want to have all the eligible labels displayed in the image 104, then a "cursor label zone" can be defined around the cursor. Labels are displayed for shapes displayed within the cursor label zone, and no labels are displayed for shapes displayed outside the cursor zone. As the cursor moves, the cursor label zone moves with the cursor, allowing the user to only see labels that are near the cursor. Thus the connectivity of a layout is auto-labeled only where the user is interested and is pointing the cursor. This can be considered a "label flashlight mode" because the user is "illuminating" different labels as the cursor is moved.

Figure 14:
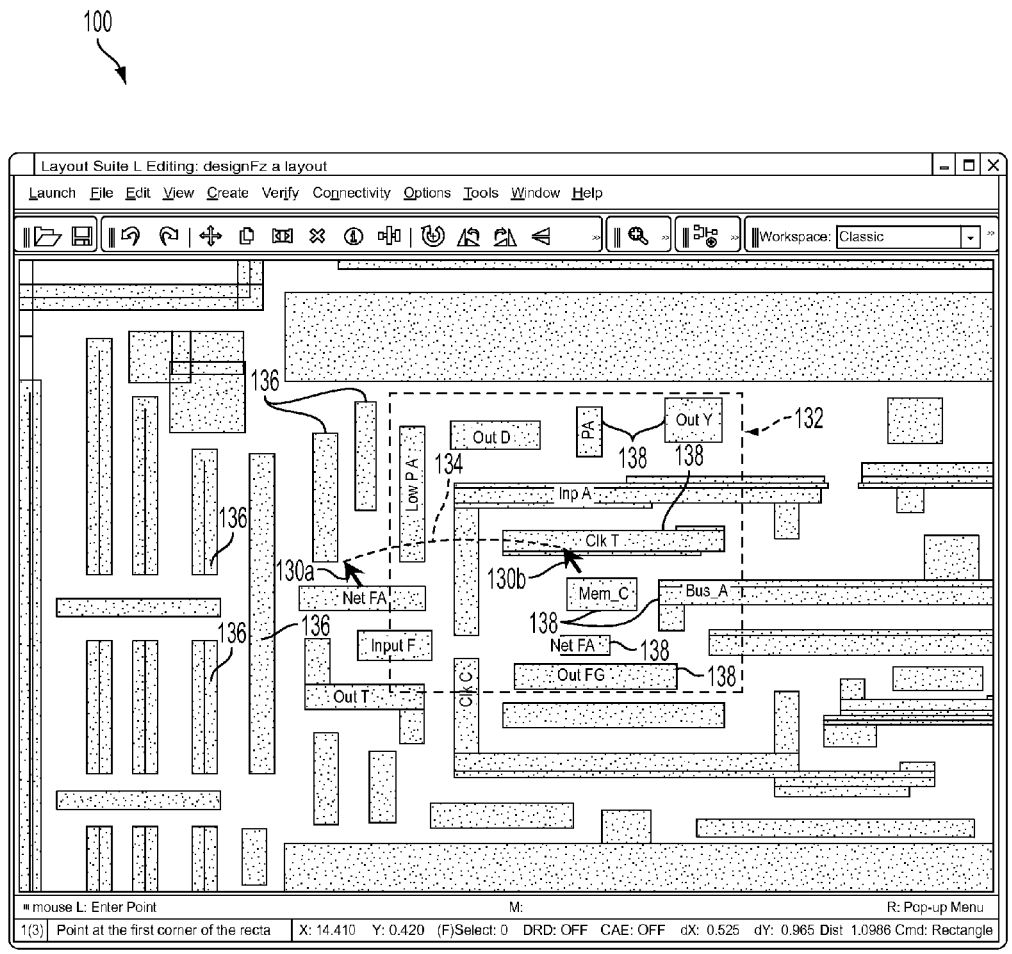

In one example as shown in FIGS. 13 and 14, a cursor 130 is controlled by a user using an input device. A cursor label zone 132 is shown surrounding and centered on the cursor 130, which is moved with the cursor 130 as the cursor is moved. Only the labels of shapes that are currently displayed within the borders of the cursor zone 132 are displayed, while labels of shapes displayed outside the zone 132 are not displayed. The cursor zone 132 is shown in FIG. 13 with a dashed line for explanatory purposes, but in the described embodiment it is actually not displayed on the screen or visible to the user. Alternate embodiments can display all or some of the borders of the zone 132.

In FIG. 14, the cursor 130 has been moved by the user from a previous position 130*a* to a new position 130*b*, as indicated by the dotted line 134, and the cursor label zone 132 has been moved correspondingly with the cursor to maintain the cursor 130 at its center. As shown in FIG. 14, the labels for shapes 136 that were previously in the zone 132 and labeled in FIG. 13, are now falling outside the cursor label zone 132 and have been removed. In the meantime, shapes 138 now fall inside the zone 132 and their labels are displayed as shown. In some embodiments, labels are displayed for shapes within the zone only if the label is eligible to be displayed, e.g., if the shape is of a size greater than the label threshold described above. In other embodiments, labels are always displayed for shapes within the zone, regardless of shape size, shape size threshold, or other conditions. In some embodiments, the dimensions of the zone 132 are configurable by the user.

Different embodiments can use different criteria for determining whether a shape is inside the cursor label zone 132. For example, one embodiment can consider a shape within the zone 132 if any portion of the shape is within the zone, while a different embodiment can consider a shape within the zone only if a majority of its displayed area is within the zone. In another embodiment, a shape can be considered within the zone 132 only if all of the displayed shape is within the zone. In another embodiment, a label associated with a shape can be displayed on the portion of the shape that is currently within the zone.

Some embodiments can automatically activate the cursor label zone only under predetermined conditions. For example, labels outside the zone can be removed from the display (or not displayed) only when a command is currently active in the interface, such as a command requiring cursor manipulation. The interface can be awaiting a further input from the user based on the cursor, for example. This condition assumes that the user is following the cursor with his or her eyes during such a command and thus the user is looking at labels near the cursor, so that labels outside the zone are unneeded. In contrast, when no such command is active, label removal does not occur, since the user may be just moving the cursor across the screen and looking at different areas of the image near or far away from the cursor.

Repeating Labels on a Shape

Some shapes displayed on the design canvas (or other displayed view) are sized relatively long in at least one dimension. Displaying a single label for such shapes may not provide sufficient information for a user to maintain or develop context in the layout, since the label may be displayed at too far a distance from a particular displayed view or location to be helpful. For example, a label displayed at the center of a large shape may be a great distance from the end portions of the shape which the user wishes to identify near a location he or she is interested in. The user may have to pan the view to see the centered label, which adds further inconvenience and possible confusion and loss of context. To remedy this condition, this embodiment repeats auto-labels multiple times on large shapes to assist the user in maintaining context.

Different embodiments can repeat a label on a shape (thus displaying the label multiple times for the shape) using different techniques. In one technique, a label can be repeated after each unit of a predetermined distance along the shape. Labels can also be displayed at the ends of shapes which have a dimension greater than a predetermined threshold.

Figure 15A:
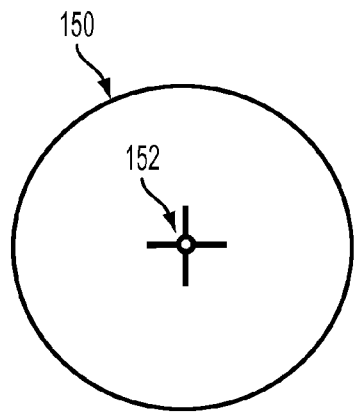
FIGS. 15A and 15B are diagrammatic illustrations of an image test to determine a zone of focus for a person.
Figure 15B:
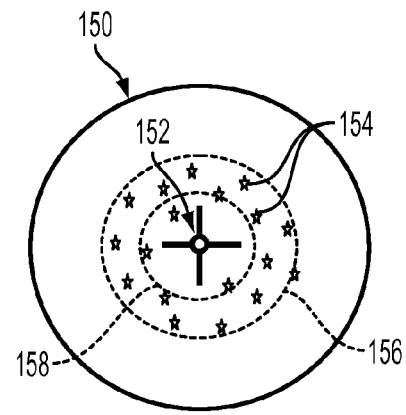

Another technique of the present invention considers the field of vision of a user, in which labels are displayed based on the user's field of vision. A standard eye test is a "Field Acuity Test" in which the field of vision of a person is tested. For example, as shown in FIG. 15A, the person can be instructed to focus his or her eyes on a projected image 152 at the center of a yellow circular field 150. Random points of light are then projected over the yellow background, and the person is instructed to press a trigger the moment he or she sees a point of light. A typical result is shown in FIG. 15B, where the person sees the points of light 154 that are within the circle 156 which is a particular radius from the center of the field 150. The area inside the smaller, innermost circle 158 is the area where the person (or the person's brain) knows exactly what is shown, the "zone of focus." This is the area in which shapes can be seen simultaneously without explicit moving or refocusing of the eyes on those shapes and sense can still be made of them. Typically, a person has a zone of focus that is approximately a 5-degree half-cone extending from the person's eye. Outside the zone of focus is the area between the innermost circle 158 and the circle 156 which is referred to as the field of vision (FOV) where a person's brain "feels" that it saw something, but it is not exactly known what is seen. Finally, further away from the center image 152 is the area outside the circle 156, which is outside the user's field of vision.

The zone of focus is the area where, for example, a person typically can read text without an explicit movement and focus of the eyes on that text. In terms of a displayed layout in interface 100, a person can thus automatically extend or infer the connectivity of a shape from a label by parsing the label that is displayed within this zone of focus. For example, if there a displayed long shape in image 104, and there is a label displayed near the edge of the shape, a user can automatically infer the connectivity of the shape by looking at the label only up to the edge of his or her zone of focus. Beyond that distance, the user needs to physically move the eyes and refocus in order to read the connectivity information and follow the shape further.

Figure 16:
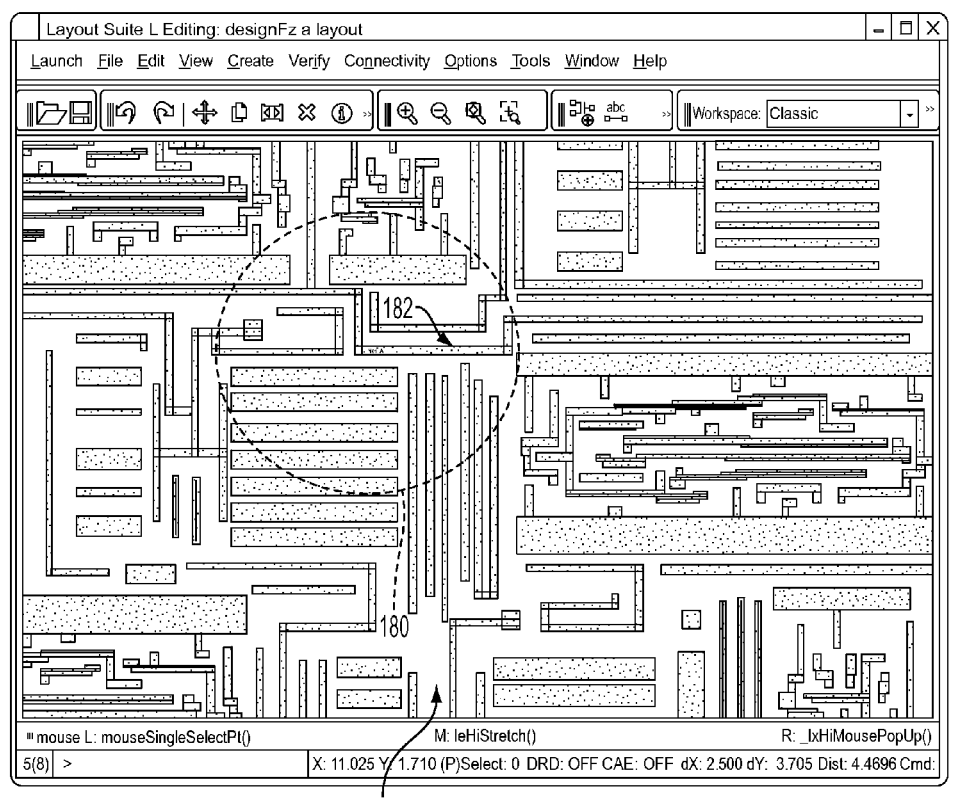
FIG. 16 is a diagrammatic illustration of the interface and depicting a zone of focus for a particular user.

FIG. 16 is a diagrammatic illustration of the interface 100 and depicting a zone of focus for a particular user. The circle 180 represents a user's zone of focus on the image 104 displayed in the interface 100. The user can read all the labels within the circle 180 quickly and easily, identify the Net_A shape 182, and parse the connectivity of the shapes up to the border of the circle 180 (only the "Net_A" label is shown displayed in FIG. 16 for explanatory purposes). Outside of the circle 180, the user would need to refocus and also need another auto-label so that the user does not rove his or her eyes up and down the Net_A shape to make sure that he or she is looking at the same Net_A shape. It should be noted that this particular example is only for explaining the zone of focus of a user, and is not an accurate representation of the size of an actual zone of focus. A zone of focus is a 5-degree half-cone projecting from the eye, and not a distance. The size on a screen for a particular zone of focus thus depends on how far a display screen is from the user's eyes, the size of the screen, the zoom factor of the viewed image, etc.

This embodiment of the present invention therefore takes advantage of the zone of focus by repeating the display of labels for displayed shapes beyond the edge of the zone of focus, also referred to as the "zone of inference" herein, since the user is able to infer connectivity and context within the zone. Within the zone, the user can infer or trace the connectivity from a label without refocusing or moving his or her eyes to a new location, and without needing another displayed label. Beyond the zone, another label can be displayed to prevent the user having to focus back on the label within the zone and trace the continuity of the shape from that location.

One way to determine a distance or area on the screen to use for the zone of focus is to estimate the 5-degree viewing cone and/or other factors. The viewing distance of the user to the display screen is one such factor. Computer interface ergonomics provide the concepts of Resting Point of Accommodation (RPA) and Resting Point of (con)Vergence (RPV), where if sustained viewing is made a closer distance than the RPV, a user may suffer eye strain. Studies show that, on average, it is recommended to view the screen about 40 inches away at horizontal eye level and 30 inches away with a recommended 30-degree downward gaze angle.

Figure 17:
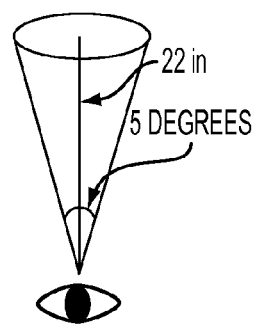
FIG. 17 is a diagrammatic illustration showing a zone of focus from an eye and using a particular viewing distance.

In one example embodiment, 22 inches between the user's eye and the displayed image 104 is assumed for standard desktop computer viewing, since most desktop computer users do not follow the convention and tend to lean much closer to display screens, and because the distance averages closer for small or portable devices such as laptop computers. FIG. 17 shows the 5-degree zone of focus from an eye when using the 22 inches viewing distance. Based on these dimensions, the diameter of the zone at the display screen can be determined as follows:

Tangent(5 degrees)*22 inches≈1.9 inches

Diameter≈1.9*2=3.8 inches.

Therefore, a label can be repeatedly displayed on the same shape approximately every 3.5 or 3.8 inches of screen; this zone of focus distance can be converted to a number of pixels for a particular screen. In some embodiments, a closer viewing distance (such as for laptop computers) can be accommodated by providing a zone of focus distance of about 2.5 to 3 inches.

In some embodiments, the zone of focus can be determined based on user input particular to the current user. For example, the user can be prompted to provide a rough estimate of the viewing distance between his or her eyes and the display screen. This user estimate is then used to determine the zone of focus diameter as follows:

2*[Tangent(5 degrees)*{distance entered}]=Diameter of Zone of Focus

In another embodiment, a human-interaction feature can be used to customize and auto-calibrate the zone of focus for each particular user and/or each time the same user uses the interface 100 by using appropriate sensor(s) and calibration techniques. For example, a desktop "webcam" can be used, which is a standard camera placed on or near the display screen and connected to a computer system for sending a video stream or pictures of the user viewing the display screen. The webcam can be placed on the display screen and focused on one of the user's eyes. Calibration software running on the computer system can recognize the pattern of the user's iris using dark and white contrast of the parts of the eye, as is known in eye pattern recognition systems. The user is asked to read a few test lines displayed on the screen, as follows: the user is asked to train his or her eyes at the center of the screen, and then a line of text is started to be displayed at the screen center, with more words of the text line becoming visible to the right of the screen center. The rate at which words appear can be the typical reading rate for an adult. The user is instructed to read the words as they appear, while the software measures the eye movement. The eye will exhibit a "jerky" movement as the user reaches the end of his or her zone of focus and has to move his or her eye to re-focus on the new word that is just outside the zone of focus. The software can detect this jerky movement to determine at what distance from the starting position the eye was moved. As more words appear, the user will read a few more words or letters, and then again get to the end of the zone of focus and must then move his or her eye again, which is detected. This technique asks the user to perform this eye movement multiple times and the results are averaged to provide a more accurate estimation of the distance (e.g., how many pixels) causes the user to move his or her eye. This number can be doubled to provide the zone of focus for that particular user. Thus the zone of focus is now customized for this user, providing the most optimal ease of use and auto-labeling.

Zone of Focus Labeling Based on a Cursor

Figure 18:
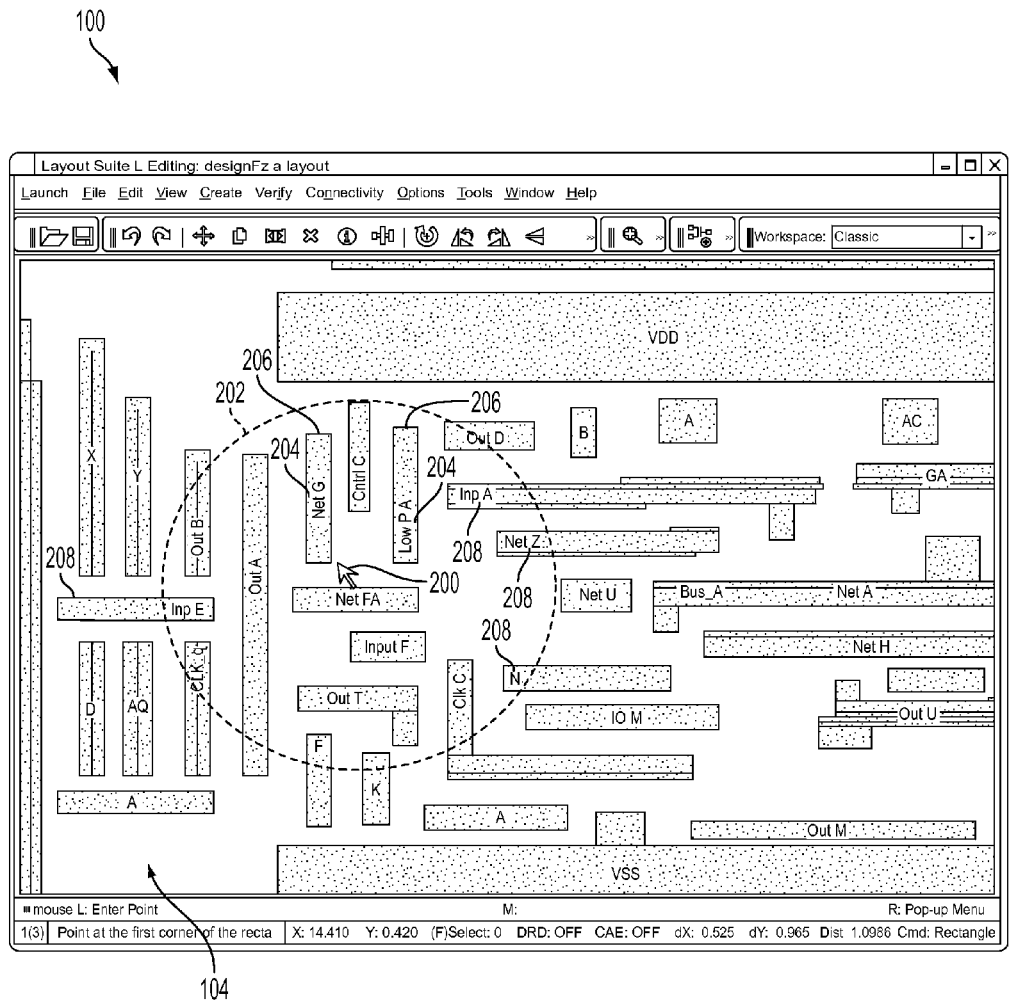
FIG. 18 is a diagrammatic illustration of the interface depicting an embodiment of focus labeling using the zone of focus of a user and based on a the location of a displayed cursor.

FIG. 18 is a diagrammatic illustration of the interface 100 depicting an embodiment of focus labeling using the zone of focus of a user and based on a the location of a displayed cursor. In this embodiment, the locations on shapes to display the repeating labels can be determined using the zone of focus described above. The ease of readability of labels gets easier for a user the closer to the center of the zone of focus the labels are. Thus, in this example embodiment, the zone of focus is assumed to be centered on a cursor that is controlled by a user using an input device 20. To better assume that the user's focus is on the cursor, some embodiments can display labels based on zone of focus only while a command using the cursor is active in interface 100 and the interface is awaiting a further input from the user based on the cursor, i.e., the user has selected a command in the interface and then is moving the cursor to complete the command, such as a deletion or edit with the cursor. Or it may otherwise be known or assumed that the user is doing an active edit using the cursor or is concentrating on the cursor.

In cases where it can be assumed the user's attention is on the cursor, the labels are displayed as close as possible to the center of the zone of focus (e.g., a pointing end or center of the cursor), while being displayed within the displayed boundaries of their associated shapes (or within a predetermined distance of their associated shapes so that it is clear which shape they refer to). However, outside the zone of focus, labels can be displayed centered on their associated shapes, since an explicit refocus of the user is needed to read these labels anyway.

An example of this focus labeling is shown in FIG. 18. Cursor 200 is shown displayed over canvas image 104. A zone of focus shown for this user as circle 202 centered on the cursor 200. In this example, labels are displayed as close to the center of the zone 202 as possible, yet still within the boundaries of their associated shape. Thus, the labels 204 are displayed near the lower border of their shapes 206 because the center of the zone 202 is currently toward that direction. The labels 208 are displayed at the extreme ends of their associated shapes to be within the zone of focus 202, if possible.

As the cursor 200 is moved when the user continues editing shapes of the displayed canvas during an active edit, the zone 202 moves correspondingly with the cursor as the cursor moves to maintain the cursor at the center of the zone. This in turn causes the labels to move to maintain a position as close as possible to the center of the zone 202. This can be referred to as "tilting the labels toward the center" of the zone 202. Thus, for example, if the cursor 200 is moved up in FIG. 18 so that the center of the zone 202 is above the shapes 206, then the labels 204 would be displayed at the top border of their associated shapes to be as close as possible to the center of the zone 202 yet still displayed within the borders of their associated shapes. Outside the zone 202, the labels can be displayed to be centered on their associated shapes, or in some other default fashion.

It should be noted that the labels will be moved to be continuously as close as possible to the center of the zone 202 only during an active task or other function when it is assumed that the user's eye is completely focused on the cursor, e.g., when the task is completed using the cursor. For example, this can be assumed during an active edit mode or similar modes requiring such user attention. However, during other modes or normal pointing of the cursor 202, the labels are not moved in this way, and are displayed in stationary positions. This is important, because otherwise the labels would be moving and shaking across the screen all the time, even when simply moving the cursor across the screen, which is not desired by the user.

Even during an active command, the focus labeling may introduce some shaky movement or jitter in the positions of the labels when the cursor 202 makes small or incremental movements. For large movements of the cursor, this is not a problem. Thus, to remove this slight jitter during small cursor movements, some embodiments can only re-display the labels at new positions to follow the center of the zone of focus if the cursor 202 has been moved a threshold distance from its last position. For example, a threshold distance of 1 cm or other suitable dimension on the display screen can be used as a default, and in some embodiments the user can have the option of configuring the threshold distance to a desired value.

Some embodiments can combine various features of the inventions described herein. For example, the zone of focus labeling of FIG. 18 can be combined with the cursor-controlled label zone of FIGS. 13 and 14, such that the label zone corresponds with the determined zone of focus, and labels outside the zone of focus are not displayed.

Figure 19:
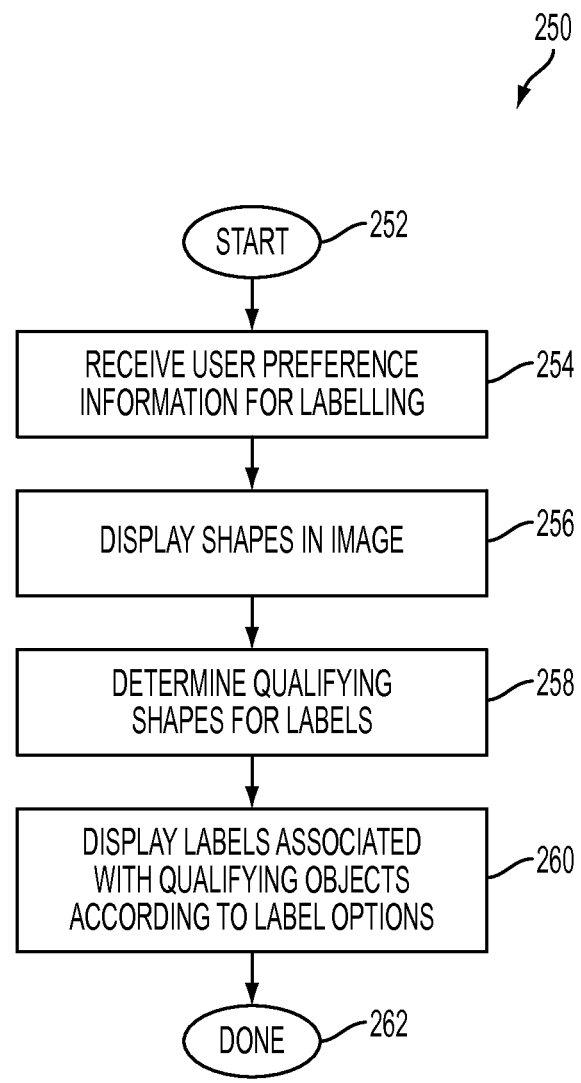
FIG. 19 is a flow diagram illustrating an example of a method of the present inventions for providing labels for graphical shapes in a graphical application.

FIG. 19 is a flow diagram illustrating one example of a method 250 of the present invention for providing labels for graphical shapes in a graphical application. Method 200 can be implemented, for example, by the components in system 20, including one or more CPUs/processors and a display device 26. Method 200 can be implemented by program instructions or code, which can be stored on a computer readable medium. Alternatively, the method 200 can be implemented in hardware (logic gates, etc.), or in a combination of hardware and software.

The method begins at 252, and in step 254, user preference information for labeling is received. Many user-specified preferences can be included in various embodiments. For example, the user can be allowed to turn on or off the automatic display of labels and/or the "label flashlight mode" described above with respect to FIGS. 13 and 14, or define the distance he or she typically views the display screen to determine the diameter of the zone of focus as described above with reference to FIGS. 15A-18. Also, the user may be allowed to define a threshold label display size for which a shape must qualify to have its associated label displayed, or the percentage or distance of overhang of labels over shapes. In some embodiments, the user can specify other characteristics of the labels, such as font, color, style, etc.

In step 256, the appropriate shapes of the canvas are caused to be displayed in the image 104 (along with any other features or details of the image and interface). Displayed image 104 can be a complete image or part of a complete image or canvas, depending on the zoom level of the interface and graphical application. In step 258, the process determines the shapes that qualify for labels. Depending on the embodiments and implementation used, this determination may include checking the shape size to see if it is over the threshold label display size. Other characteristics may also be used to determined whether labels are displayed for that shape.

In step 260, the appropriate labels are displayed associated with qualifying objects according to label options in effect. The label options can include one or more of any of the embodiments described above. For example, if the label flashlight mode is on, then particular labels within the flashlight zone are displayed. A zone of focus may be in use to influence label display and location as described above, which is another label option influencing step 260. Other options include the other various embodiments and options described herein. The process is then complete at 262. Various options may be selected or changed by the user, which causes the steps 258 and 260 to be reinitiated as appropriate.

Additional Embodiments

One embodiment of the invention provides filtered automatic labeling of shapes. A user may be interested only in some, but not all, shapes displayed in the image 104, and thus may want displayed labels only for the shapes of interest. Multiple different techniques for label filtering can be used to accommodate this preference, or used in combination where appropriate.

In an "Advanced Regular Expressions" label filtering embodiment, a user can set the filtering option by using regular expressions for filtering the displayed labels. For example, a user could input an expression "VDD" in a displayed input field for a filtering option so that only labels having the term "VDD" are displayed. Thus, all nets and pins having connectivity matching this term would be labeled, such as AVDD, AVDD!, VDD, VDD!, QAVDD, etc. In some embodiments, the user can also include Boolean expressions and operators to express a filtering preference, similar to searching or query expressions.

In a "Purpose Based Filtering" embodiment, the user can filter labels based on a function, purpose, or other characteristic of the shapes which are labeled. For example, the user can be presented a list of different functions of shapes, and select one or more functions to filter by. For example, a user can choose to filter labels based on shapes/labels associated with CLOCK, POWER, and/or SIGNAL functions, or other functions. In one example, a database provides for a shape characteristic of a "sigType," which is a signal type of the signals sent through the associated shape. The user can choose to filter shapes based on those types. For example, the user can choose to filter labels based on a sigType of "clock," "power," "signal," etc., regardless of what text is included in the labels.

In a "Connectivity Based Filtering" embodiment, the user can provide a list of instances (such as transistor components, wells, etc.) or nets within the canvas, and only the structures on the canvas that are part of the connectivity of the specified instance or net are labeled. In some embodiments, the particular filtering list may be created from a complete list of instances, nets, or shapes which is accessible from the graphical editing application.

Such filtering techniques can be very useful for the user in maintaining context while editing and viewing graphical layouts and canvases. As the user zooms in the displayed view, the shapes that the user has designated are of interest (through the filtering options) are automatically displayed with labels, and the user thus would not have to search for these shapes, thereby increasing productivity.

Other labeling features of the invention can also be used. In some embodiments, "label uniquification" can be used to hide unnecessary or redundant portions of a label so as to reduce clutter and extraneous information displayed on the screen and only display parts of the label that are needed to uniquely identify the shape. In one technique, the user or option can designate how many characters (such as letters, number digits, punctuation, symbols, etc.) of the label to display, such that redundant letters are removed. For example, if one net name is "cntlA_blck_1_reserved_..." and it is known that this portion of the design has only net names of "cntlA ...", "cntlB_...", "cntlC_..." then a label is only needed for the first 5 letters to uniquely identify a particular net; the rest of the label ("_blck_1_reserved") is not needed and would not be displayed. This prevents cluttering the canvas with unnecessary information.

In some embodiments of the present invention, intelligent detection is made of the number of characters of a label to display on a shape or in an area, such that the labels are identifiable uniquely. Furthermore, an option can be provided, selectable by user or administrator, to cause unique detection of characters of labels either from the start toward the end of the label, or from the end of the label toward the start, or to vary the direction of character detection based on specific instructions or criteria, or based on performed analysis of the label. For example, if one label is "cntlA_blck_1_reserved_A" and a second label is "cntlA_blck_1_reserved_B", then it can be determined that parsing from the end of the labels for uniquely identifying the labels is a better option, based on the number of characters needed to be displayed for the user to uniquely identify the labels.

In some embodiments, labels are displayed contained within the boundaries of the shape with which they are associated, as described above. Other embodiments can display labels outside of their associated shapes, e.g. close to the shapes or having an indicator such as a line or pointer showing the association. A combination of these display methods can also be used.

Some embodiments can automatically adjust the positions of labels to avoid overlapping the display of the labels. Labels can be adjusted in location (e.g., moving the label a particular distance on the canvas) and/or in orientation (e.g., rotating the label, such as from horizontal orientation to vertical orientation). For example, if two shapes on the canvas are known to be of interest to the user, and a horizontal label cannot be completely displayed without overlapping a vertical label, then the vertical label can be automatically displaced to avoid the overlap.

In some embodiments in which labels are normally displayed within the boundaries of shapes, "label overhang" can be used and may be adjustable by the user. This allows a label to be moved to overhang a shape, i.e. a portion of the label can be displayed outside the shape. This can occur if the shape is too small to contain the entire label, or to reduce overlap or confusion of two or more labels displayed the screen, etc. Since having lots of label overhang may contribute to screen clutter, the user (including an administrator) can be allowed to provide input to the interface 100 indicating a maximum distance that a label can displayed outside its associated shape, or indicate a maximum percentage of the shape size or dimension (width, height) over which the label may overhang a border of the associated shape.

In some embodiments, the user can edit the connectivity of a shape by selecting a label associated with the shape. For example, the user may click on a label using a cursor controlled by an input device, which causes a prompt or editing controls to be displayed by the interface 100. The user can then change the connectivity of the shape associated with the selected label. For example, the user could change a label of a "VSS" shape to "VDD" to cause the shape to be connected to the VDD net.

Many user-specified preferences can be included in various embodiments. For example, the user can be allowed to turn on or off the automatic display of labels using a menu item, icon, or other control of the interface. When auto-labels are off, no labels would be displayed and the user could opt to manually label shapes. In some embodiments, the user can be allowed to turn on or off the "label flashlight mode" described above with respect to FIGS. 13 and 14. Some embodiments can prompt the user to define the distance he or she typically views the display screen, and use that information to determine the diameter of the zone of focus as described above with reference to FIGS. 15A-18. In other embodiments, the user can define a threshold label display size for which a shape must qualify to have its associated label displayed, e.g. the user can specify a threshold width for the shape (in pixels or real units like millimeters). In some embodiments, the user is also allowed to specify the percentage of "overhang" of labels over shapes, as described above. In some embodiments, the user can specify other characteristics of the labels, such as font, color, style, etc.

The various labeling features of the present invention allow easy identification in layout design, schematics viewing and editing, and other graphical viewing and editing applications. The user does not have to select and query individual shapes to determine identity or connectivity. In addition, there is no longer a need for manual labeling of shapes in a connectivity-driven environment, saving the user an enormous amount of time. Furthermore, doing any kind of work on an unfamiliar layout becomes very easy because the user is always guided by the connectivity information provided by the displayed labels. When the user can see a shape clearly on the screen, the user typically also can see the label for that shape and thus know its connectivity. Any shape that can be the object of focus or work is labeled automatically. Furthermore, during static display or during dynamic display (such as during/after zooming, panning, or editing), the user always knows the connectivity of shapes around the points of interest, so the user is always in touch with the layout and knows his or her context in the layout.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for displaying shape information in a graphical interface using a computer system, the method comprising:
    causing a display of a view of at least a portion of a design on a display device, wherein one or more shapes of the design are displayed in the view, and wherein each of the one or more shapes is associated with one of a plurality of labels;
    causing a display of a cursor on the display device, a displayed position of the cursor being controlled by a user of the graphical interface using an input device; and
    in response to the cursor being positioned within the view, causing a display in the view of a first subset of the labels in a predetermined zone relative to the displayed cursor, the zone covering only a portion of the view, and wherein a second subset of the labels outside of the zone and in the view are not displayed in the view.

2. The method of claim 1 wherein the shapes represent traces in a circuit layout design.

3. The method of claim 1 wherein the first subset of labels is displayed overlaid on its associated shapes.

4. The method of claim 1 wherein each of the labels is displayed only if the associated shape is above a predetermined threshold size.

5. The method of claim 1 wherein the predetermined zone is an area centered on the displayed cursor.

6. The method of claim 5 wherein the second subset of labels are not displayed outside of the predetermined zone only when a command using the cursor is currently active in the graphical interface and is awaiting a further input from the user based on the cursor.

7. The method of claim 1 wherein the first subset of labels is displayed in the view on the display screen in response to an associated subset of the shapes having at least a portion currently positioned in the view and within the predetermined zone, and wherein the second subset of labels is not displayed in the view in response to an associated subset of the shapes positioned in the view and outside the zone.

8. The method of claim 1 wherein labels are repeatedly displayed for a single shape for at least one of the shapes, such that the single shape has multiple displayed labels.

9. A computer program product comprising a non-transitory computer readable medium including program instructions to be implemented by a computer and for displaying shape information in a graphical interface, the program instructions for:
    causing a display of a view of at least a portion of a design on a display device, wherein one or more shapes of the design are displayed in the view, and wherein each of the one or more shapes is associated with one of a plurality of labels;
    causing a display of a cursor on the display device, a displayed position of the cursor being controlled by a user of the graphical interface using an input device; and
    in response to the cursor being positioned within the view, causing a display in the view of a first subset of the labels in a predetermined zone relative to the displayed cursor, the zone covering only a portion of the view, and wherein a second subset of the labels outside of the zone and in the view are not displayed in the view.

10. The computer program product of claim 9 wherein the shapes represent traces in a circuit layout design.

11. The computer program product of claim 9 wherein the first subset of labels is displayed overlaid on its associated shapes.

12. The computer program product of claim 9 wherein each of the labels is displayed only if the associated shape is above a predetermined threshold size.

13. The computer program product of claim 9 wherein the predetermined zone is an area centered on the displayed cursor and tracking the cursor.

14. The computer program product of claim 13 wherein the second subset of labels are not displayed outside of the predetermined zone only when a command using the cursor is currently active in the graphical interface and is awaiting a further input from the user based on the cursor.

15. The computer program product of claim 9 wherein the first subset of labels is displayed in the view in response to an associated subset of the shapes having at least a portion currently positioned in the view and within the predetermined zone, and wherein the second subset of labels is not displayed in the view in response to an associated subset of the shapes positioned in the view and outside the zone.

16. A system for displaying shape information in a graphical interface using a computer system, the system comprising:
    a memory; and
    a processor in communication with the memory, the processor:
    causing a display of an image on a display device, wherein one or more shapes are displayed in the image;
    causing a display of a cursor on the display device, a displayed position of the cursor being controlled by a user of the graphical interface using an input device; and
    causing a display of a plurality of labels on the display device, each of the labels associated with a different one of the displayed shapes, wherein the plurality of labels are displayed within a predetermined zone relative to the displayed cursor, and wherein no labels are displayed outside of the zone,
    wherein each of the plurality of labels is displayed overlaid on its associated shape by the processor, and wherein each of the labels is displayed by the processor only if the associated shape is above a predetermined threshold size.

17. The system of claim 16 wherein the shapes represent traces in a circuit layout design.

18. The system of claim 16 wherein each of the labels is displayed in the image only if at least a portion of the shape associated with the label is currently positioned in the image and within the predetermined zone.

19. The system of claim 16 wherein the predetermined zone is an area centered on the displayed cursor.

20. The system of claim 19 wherein the labels are not displayed outside of the predetermined zone only when a command using the cursor is currently active in the graphical interface and is awaiting a further input from the user based on the cursor.

* * * * *